United States Patent [19]

Nishiya et al.

[11] Patent Number: 5,774,470
[45] Date of Patent: Jun. 30, 1998

[54] DIGITAL SIGNAL PROCESSOR, ERROR DETECTION METHOD, AND RECORDING MEDIUM REPRODUCER

[75] Inventors: Takushi Nishiya, Machida; Shoichi Miyazawa, Yokohama; Kazutoshi Ashikawa, Maebashi; Ryushi Shimokawa, Takasaki; Seiichi Mita, Tsukui, all of Japan

[73] Assignee: Hitachi, Ltd., Tokyo, Japan

[21] Appl. No.: 524,040

[22] Filed: Sep. 6, 1995

[30] Foreign Application Priority Data

Sep. 6, 1994 [JP] Japan .................................. 6-212730

[51] Int. Cl.⁶ .................................................. G11B 20/18
[52] U.S. Cl. ...................................................... 371/3
[58] Field of Search ............................ 371/3, 5.1, 46, 371/43

[56] References Cited

U.S. PATENT DOCUMENTS

| | | | |
|---|---|---|---|
| 5,113,400 | 5/1992 | Gould et al. | 371/43 |
| 5,142,551 | 8/1992 | Borth et al. | 375/219 |
| 5,144,644 | 9/1992 | Borth et al. | 375/341 |
| 5,263,052 | 11/1993 | Borth et al. | 375/262 |
| 5,271,042 | 12/1993 | Borth et al. | 375/348 |

OTHER PUBLICATIONS

G. David Forney, "Maximum–Likelihood Sequence Estimation of Digital Sequences in the Presence of Intersymbol Interference", IEEE Transactions on Information Theory, vol. IT–18, No. 3 May 1972 PP. 363–378.

H. Kobayashi, "Application of Probabilistic decoding to Digital Magnetic Recording Systems," IBM J. Res. Develop., Jan. 1971 pp. 64–74.

Cideciyan et al., "A PRML System for Digital Magnetic Recording, " IEEE J. on Selected Areas in Communications, vol. 10, No. 1, Jan. 1992 pp. 38–56.

*Primary Examiner*—Stephen M. Baker
*Attorney, Agent, or Firm*—Antonelli, Terry, Stout, & Kraus, LLP

[57] ABSTRACT

A playback signal processing circuit for reducing decode errors and enabling high-density digital magnetic recording and a digital magnetic recording reproducing unit using the playback signal processing circuit are provided. An estimated waveform generation circuit uses the decoding result of a PRML channel to generate an ideal playback signal waveform. A subtractor provides a waveform representing a difference between the waveform and an actual playback signal. There is a high probability that error bits will occur at an interval of two or four bits because of the nature of GCR code and maximum-likelihood decoding; in the error state of each bit, one bit is incremented by one with respect to the correct bit value and the other signal bit is decremented by one. From this fact, an error detection circuit discriminates an error difference waveform pattern and an error discrimination circuit detects an error bit interval, whereby an error correction circuit carries out error bit correction.

12 Claims, 25 Drawing Sheets

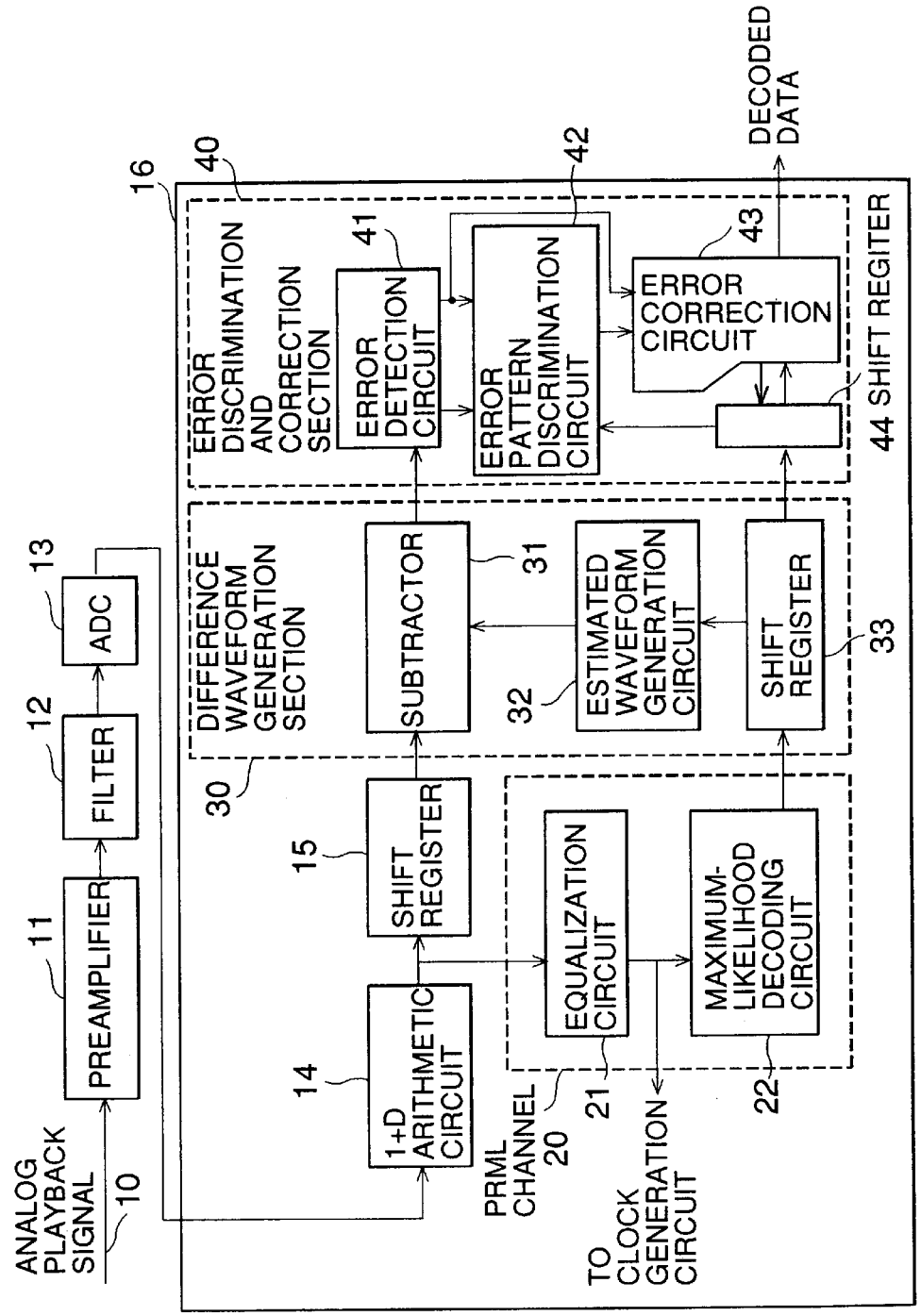

RECORD CORD(NRZ CODE)

INTERMEDIATE CODE(INRZI CODE)

PLAYBACK WAVEFORM

PLAYBACK WAVEFORM AFTER(1+D) CALCULATION

EQUALIZATION WAVEFORM

DECODING RESULT BY PRML

FIG.4

| BIT PATTERN | ADDRESS | BIT PATTERN | ADDRESS |
|---|---|---|---|
| 0, 0, 0 | 0000 | — | — |
| 0, 0, 1 | 0001 | 0, 0, -1 | 1001 |
| 0, 1, 0 | 0010 | 0, -1, 0 | 1010 |
| 0, 1, -1 | 0011 | 0, -1, 1 | 1011 |
| 1, 0, 0 | 0100 | -1, 0, 0 | 1100 |
| 1, 0, -1 | 0101 | -1, 0, 1 | 1101 |
| 1, -1, 0 | 0110 | -1, 1, 0 | 1110 |
| 1, -1, 1 | 0111 | -1, 1, -1 | 1111 |

ERROR DISCRIMINATION PATTERN

DIFFERENCE WAVEFORM WHEN AN ERROR OCCURS
AT 2-BIT INTERVAL
(2-BIT INTERVALS, POSITIVE PHASE, K=3.0)

RECORD CORD

INTERMEDIATE CODE

PLAYBACK WAVEFORM AFTER (1+D) CALCULATION

DECODING RESULT BY PRML

ESTIMATED WAVEFORM

DIFFERENCE WAVEFORM dk

SUM-OF-PRODUCT WAVEFORM rk

DECODING RESULT AFTER ERROR CORRECTION

FIG.8A

POSITIVE PHASE ERROR

| | |
|---|---|
| (1) | $r_k \geqq r_{k-1}$ AND $r_k \geqq r_{k+1}$ |
| (2) | $d_{k-1} \geqq t$ AND $d_{k+1} \leqq -t$ |

FIG.8B

NEGATIVE PHASE ERROR

| | |
|---|---|
| (1) | $r_k \leqq r_{k-1}$ AND $r_k \leqq r_{k+1}$ |
| (2) | $d_{k-1} \leqq -t$ AND $d_{k+1} \geqq t$ |

FIG.11

|  | S4 = 1 (S2 = 0) | S2 = 1 (S4 = 0) |
|---|---|---|
| P = 1 (N = 0) | K1 = -1, K2 = 0 K3 = 0, K4 = +1 | K1 = 0, K2 = -1 K3 = +1, K4 = 0 |
| N = 1 (P = 0) | K1 = +1, K2 = 0 K3 = 0, K4 = -1 | K1 = 0, K2 = +1 K3 = -1, K4 = 0 |

FIG.12

| ERRONEOUS RESULT | CORRECT RESULT | ERROR TYPE |
|---|---|---|
| -1, *, 1 | 0, *, 0 | BIT APPEARANCE |
| 0, *, 0 | 1, *, -1 | BIT DISAPPEARANCE |
| 0, *, 1 | 1, *, 0 | BIT SHIFT |
| -1, *, 0 | 0, *, -1 | BIT SHIFT |

FIG.19

| ADDRESS | CONTENTS | ADDRESS | CONTENTS |
|---------|----------|---------|----------|
| 0000 | 000000 | — | — |
| 0001 | 001001 | 1001 | 110111 |
| 0010 | 011111 | 1010 | 111111 |
| 0011 | 010111 | 1011 | 101001 |
| 0100 | 001001 | 1100 | 110111 |
| 0101 | 000000 | 1101 | 000000 |
| 0110 | 101001 | 1110 | 010111 |
| 0111 | 000111 | 1111 | 111001 |

DIGITAL SIGNAL PROCESSOR, ERROR DETECTION METHOD, AND RECORDING MEDIUM REPRODUCER

BACKGROUND OF THE INVENTION

1. Field of the Invention

This invention relates to a digital signal decoding method and more particularly to signal processing performed when an analog signal representing coded binary data transmitted via a channel is converted into digital form for decoding.

2. Description of the Related Art

The magnetic recording density is steadily increasing year after year. A peak detection channel for detecting the peak of an analog signal for each bit is widely used in conventional digital magnetic recording reproducers. As the recording density and the transfer rate increase, a 1-bit detection window on a normal peak detection channel becomes very small, hindering detection reliability.

As an alternative method, a partial response maximum likelihood (PRML) channel is discussed in the following papers:

(1) Forney, "Maximum-Likelihood Sequence Estimation of Digital Sequences in the Presence of Intersymbol Interference", IEEE Trans. on Info. Theory, vol.IT-18, No.3, May, 1972.

(2) Kobayashi, "Application of Probabilistic Decoding to Digital Magnetic Recording System," IBM J. Res. Develop., January, 1971.

(3) Cideciyan et al., "A PRML System for Digital Magnetic Recording," IEEE J. on Selected Areas in Communications, Vol.10, No.1, January, 1992.

The PRML channel is characterized by polynomials (1−D) (1+D) and is very sensitive to signal waveform change and equalization error caused by nonlinearity of a digital magnetic recording process caused by clearance of parts, asymmetry of pulses, an increase in the recording density on recording media, etc. The PRML channel detects a bit string of the maximum likelihood from among all possible data symbol sequences, which is performed efficiently by using a method called a Viterbi algorithm. In the Viterbi algorithm, signals are not detected independently of each other but are detected from the sequences preceding and following the bit string.

Although the PRML channel is used, if the magnetic recording density increases, the bit error rate also tends to increase.

Thus, a robust signal processing system for signal waveform variation is desired to allow for an equalization error caused by nonlinearity of a magnetic recording process as the recording density increase. Error detection and error correction are required to provide a robust signal processing system.

SUMMARY OF THE INVENTION

It is therefore an object of the invention to provide a digital signal processor, a digital signal decoding method, and a recording medium reproducer enabling detection of a decode error from a decode value.

It is another object of the invention to provide a digital signal processor, a digital signal decoding method, and a recording medium reproducer lowering a bit error rate even if the magnetic recording density is made high.

To these ends, according to one aspect of the invention, there is provided a digital signal processor for decoding a signal encoded by a predetermined data encoding system, the digital signal processor comprising:

a decoding circuit for decoding the encoded signal;

an estimated waveform generation circuit for generating a signal waveform estimated to result when noise of the encoded signal is removed from a decode value decoded by the decoding circuit;

a difference waveform generation circuit for generating a difference waveform representing a difference between the signal waveform generated by the estimated waveform generation circuit and the playback signal; and a detection circuit for detecting a decode error in the decoding circuit based on the difference waveform generated by the difference waveform generation circuit.

According to another aspect of the invention, there is provided an error detection method used when a signal encoded by a predetermined data encoding system is decoded, the method comprising the steps of:

decoding the encoded signal;

generating a signal waveform estimated to result when noise of the encoded signal is removed from a decode value decoded;

subtracting the generated signal waveform from the encoded signal and generating a difference waveform representing the difference; and when an absolute value of amplitude of the difference waveform is greater than a predetermined threshold, assuming that an error occurs and thus detecting a decode error.

Such digital decoding steps can be used for a recording medium reproducing unit. The detection circuit can further include a correction circuit for correcting the decode value decoded by the decoding circuit when the error occurs.

In the invention, the digital signal processor processes a sample value of an analog signal corresponding to encoded binary data. For 8/9 GCR code, the decoding means uses a Viterbi detection algorithm to decode an encoded signal into coded binary data.

To detect a decode error caused by an equalization error due to nonlinearity of a magnetic recording process or noise occurring from recording media, etc., the estimated waveform generation means assumes that the decode value decoded by the decoding means is valid, and estimates a signal waveform to be provided when noise of the encoded signal (playback signal) is removed from the decode value decoded by the decoding circuit;

The difference waveform generation means generates a difference waveform representing the difference between the signal waveform and an actual playback signal.

The detection circuit can detect a decode error in the decoding means based on the difference waveform generated by the difference waveform generation circuit. For example, when the absolute value of amplitude of the difference waveform generated by the difference waveform generation circuit is greater than a predetermined threshold, an error can be assumed to occur.

In the PRML channel, in almost all cases, a decode error appears as code inverted at even bit intervals of two bits, four bits, etc., from alternation of a magnetic field when magnetic recording and restriction of magnetic transition intervals because of 8/9 GCR code. The difference waveform when a decode error occurs in the decoding means becomes a waveform where code variation caused by the decode error causes intersymbol interference. By discriminating this difference waveform, the error can be detected and corrected from the decode value provided as an output of the PRML channel.

In the invention, a difference waveform is generated representing the difference between a signal waveform using a decode value provided by the decoding means and a playback signal waveform, whereby an amplitude waveform caused by only error bits contained in the decode value can be generated, whereby information on the waveform resulting from only the error bits (difference waveform) can be used for improving the S/N (signal-to-noise) ratio, enabling not only a reduction in the code error rate, but also an increase in the code recording density on recording media and improvement in the data transfer rate.

According to the invention, a decode error can be detected from a decode value in the digital signal processor, the digital signal decoding method, and the recording medium reproducing unit. The detected decode error can also be corrected. Thus, there can be provided a digital signal processor, a digital signal decoding method, and a recording medium reproducing unit enabling the bit error rate to be lowered even when the magnetic recording density is made high.

BRIEF DESCRIPTION OF THE DRAWINGS

In the accompanying drawings:

FIG. 1 is a block diagram of a digital signal processor in a first embodiment of the invention;

FIG. 4 is a table of addresses generated by an address generation circuit in the difference waveform generation section;

FIG. 8A and 8B are illustrations showing error detection thresholds in error position detection circuit and difference determination circuit;

FIG. 11 is an illustration showing register setup values in the error correction circuit;

FIG. 12 is an illustration of bit error examples;

FIG. 19 is an illustration showing the contents stored in a RAM in an estimated waveform generation circuit;

DESCRIPTION OF THE PREFERRED EMBODIMENTS

Figure 2A:
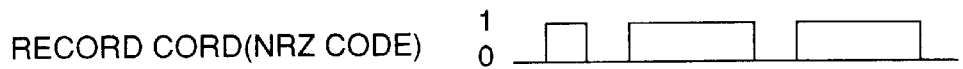
FIG. 2A to 2F are waveform charts of decoding results of a PRML channel.

Referring now to the accompanying drawings, there are shown preferred embodiments of the invention.

In the embodiments, an ideal waveform is estimated from the decoding result of maximum-likelihood decoding and a difference waveform between the estimated waveform and playback signal waveform is generated, thereby detecting an error caused by a decoding error. As described below, there is a high probability that error bits will occur as a bit pair at an interval of two or four bits (or more even number of bits) because of the nature of GCR (group coded recording) code and maximum-likelihood decoding. In the error state of each bit in the pair, one bit is incremented by one with respect to the correct bit value and the other signal bit is decremented by one. From this fact, the error bit position and error state can be detected and the error can be corrected by discriminating the decoding result pattern.

FIG. 1 is a block diagram of a digital signal processor. In the figure, the digital signal processor 16 comprises a preamplifier 11 having an AGC (automatic gain control) function, a low-band pass filter 12 for removing noise, an ADC (analog-digital converter) 13 for converting an analog input signal into a digital sample value according to a given clock, a (1+D) arithmetic circuit 14 for adding a sample value at one clock and a sample value input one clock before and outputting the result, a shift register 15 for temporarily storing output of the (1+D) arithmetic circuit 14, a PRML channel 20 for decoding encoded data, a difference waveform generation section 30 for generating a difference waveform between a waveform estimated from the decoding result and a playback signal, and an error discrimination and correction circuit 40 for detecting an error from the difference waveform and correcting the error. The PRML channel 20 comprises an equalization circuit 21 for equalizing waveforms and a maximum-likelihood decoding circuit 22 for decoding in a predetermined PRML system and outputs a sequence of codes of ternary signal of +1, 0, −1. The difference waveform generation section 30 comprises an estimated waveform generation circuit 32 for estimating a waveform from the decoding result, a subtractor 31 for finding a difference waveform between the estimated waveform and playback signal, and a shift register 33 for temporarily storing the decoding result. The error discrimination and correction section 40 comprises an error detection circuit 41 for detecting an error from the difference waveform, an error pattern discrimination circuit 42 for specifying the position of an error bit, an error correction circuit 43 for correcting the error bit, and shift register 44 for temporarily storing the decoding result.

Output of the equalization circuit 21 is sent to a clock generation circuit, which then generates clocks used in sections of the digital signal processor 16 of the invention and supplies the clocks to these sections.

Figure 22:
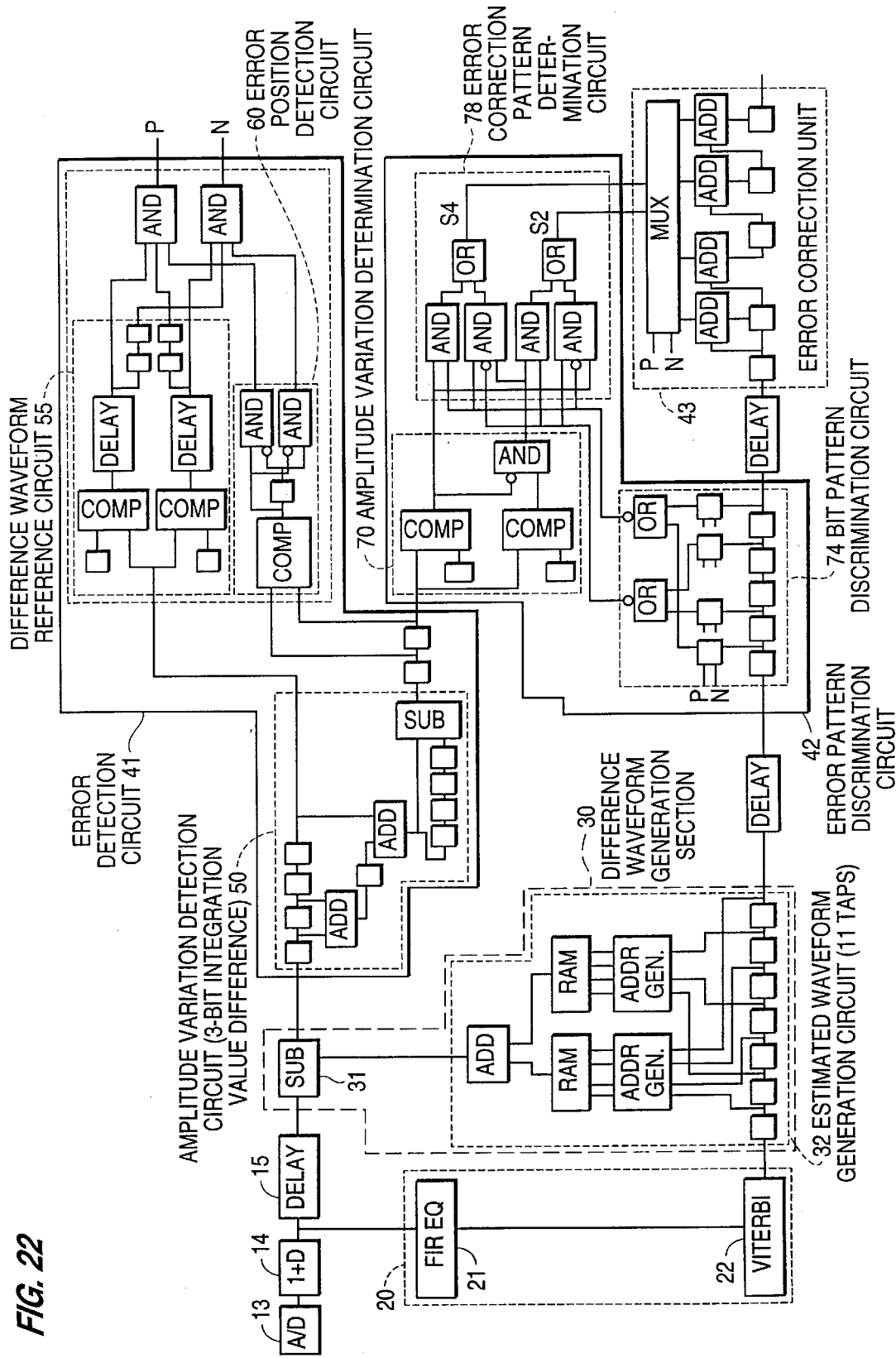
FIG. 22 is a schematic circuit block diagram of the digital signal processor in the first embodiment of the invention.

FIG. 22 is a schematic circuit block diagram of the digital signal processor 16 shown in FIG. 1. The block diagram in FIG. 22 shows the circuits of the blocks in the block diagram shown in FIG. 1. The detailed configurations of the circuits are further shown in FIGS. 3, 5, 9, and 10. Circuit parts having the same function are denoted by the same reference numerals in the figures. The functions of the circuits in FIG. 22 will be discussed later with reference to FIGS. 1, 3, 5, 9, and 10. Shift registers or delay circuits in the figures are used mainly for timing recovery and may be contained in the blocks or located outside the blocks and shared among the blocks.

In FIG. 1, a signal processing channel is connected to a line 10 via which an analog playback signal is supplied from a transducer. For example, a device such as a transmitter or a magnetic or optical read head for reading data from a digital storage device is available as the transducer. The playback signal is an analog signal encoded and stored in a digital storage device; the embodiment uses an 8/9 data sequence as an encoding system. Any other encoding system can also be used. The 8/9 data sequence is a binary data sequence encoded using 8/9 GCR code when data is written to a digital storage. For the 8/9 GCR code, 8-bit data is encoded into a 9-bit code word.

The playback signal passes through the preamplifier 11 having an AGC function and the low-band pass filter 12. The ADC 13 converts the analog input signal into a digital sample value according to a given clock. Next, the digital sample value is passed to the (1+D) arithmetic circuit 14, which adds the sample value at one clock and the sample value input one clock before and outputs the result to the shift register 15 and the PRML channel 20. The PRML channel 20 outputs a sequence of codes (ternary signal of +1, 0, -1) according to a known processing system. The decoding result of the PRML channel 20 is sent via the shift register 33 to the estimated waveform generation circuit 32, which then generates an estimated waveform using the decoding result of the maximum-likelihood decoding circuit 22. The subtractor 31 calculates a difference waveform between the playback signal resulting from calculating (1+D) by the (1+D) arithmetic circuit and received from the (1+D) arithmetic circuit via the shift register 15 and output of the estimated waveform generation circuit 32, and sends the difference waveform to the error discrimination and correction section 40. The error detection circuit 41 collates the previously stored difference waveform pattern upon the occurrence of an error with the difference waveform received from the subtractor 31, so as to detect an error. If an error is detected, the error pattern discrimination circuit 42 specifies the error state and error bit position using the contents of the shift register 44 and the difference waveform and an error signal input from the error detection circuit 41. The error correction circuit 43 corrects the corresponding bit of the shift register 44 based on the error signal input from the error detection circuit 41 and the discrimination result of the error pattern discrimination circuit 42. The data passed through the shift register 44 is output as the final decoded data.

Figure 2B:
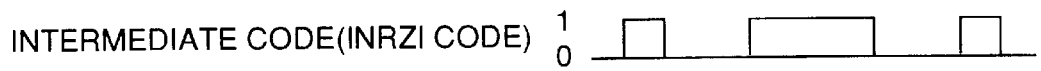
Figure 2C:
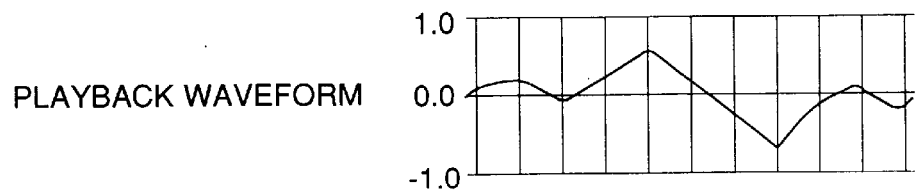
Figure 2D:
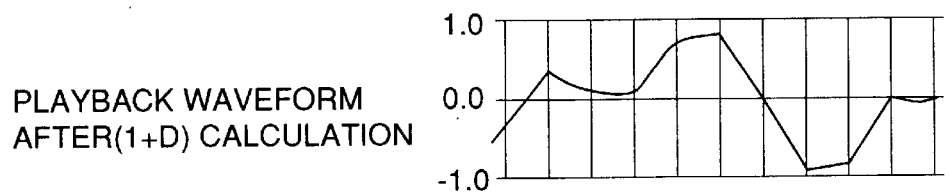
Figure 2E:
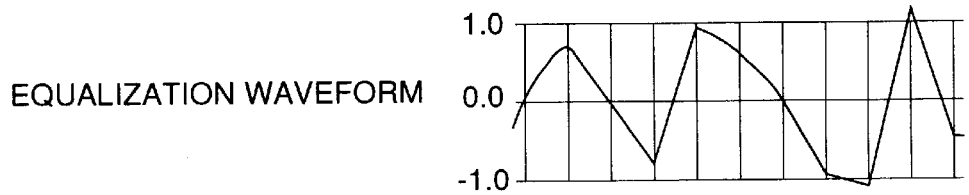
Figure 2F:
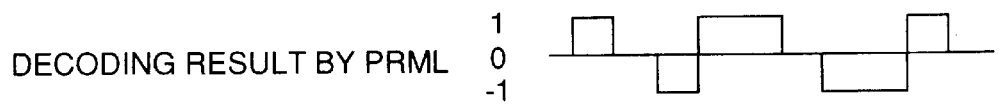

The embodiment will be discussed in detail. First, the PRML channel will be simply described using a record data example when magnetic recording. FIG. 2A shows record data, FIG. 2B shows data written onto media, FIGS. 2C, 2D and 2E show waveform charts in sections when decoding, and FIG. 2F shows data of the decoding result.

The 8-bit (1-byte) code to be recorded is encoded into a 9-bit record code according to a predetermined 8/9 GCR code conversion rule, for example, the conversion rule described in Japanese Patent Publication (KOKOKU) No. Hei 3-6699. FIG. 2A shows an example in which data encoded with 8/9 GCR code is represented by a NRZ (non return to zero) code sequence recorded on recording media (encoding system for relating bit information to two states for recording). The actual waveform written onto recording media is intermediate code, called INRZI (interleaved NRZI (non return to zero inverted) code) provided by performing processing as shown in Expression 1 for record code, like the waveform chart shown in FIG. 2B.

$$b_i = a_i + b_{i-2} \ (modulo\ 2) \qquad \text{Expression 1}$$

where
$a_i$: Record code
$b_i$: Intermediate code

When the code is read from magnetic recording media, it becomes a waveform as shown in FIG. 2C, a ternary waveform, from the differential characteristic of the channel.

FIG. 2D shows a waveform resulting from (1+D) processing performed by the (1+D) arithmetic circuit 14 shown in FIG. 1 which adds a sample value at one clock and a sample value input one clock before. FIG. 2E shows a waveform provided by the equalization circuit 21 shown in FIG. 1 which performs equalization processing for the waveform after (1+D) calculation. If encoding with interleaved NRZI code is performed, an impulse response of the channel to 1-bit isolated data on the record side becomes a ternary response of (1, 0, -1). In the interleaved NRZI code, each bit has an effect on only the bit and the bit delayed by two bits. Therefore, the decoding circuit using the PRML system processes a sequence of even bits and a sequence of odd bits in parallel as two separate sequences. FIG. 2F shows the maximum-likelihood decoding result found using the Viterbi decoding method for the equalization result in FIG. 2E for the sequences of even bits and odd bits in the maximum-likelihood decoding circuit 22 shown in FIG. 1. The original record code (NRZ code) can be obtained by converting 1 and -1 of the decoding result into 1 and 0 into 0.

Figure 3:
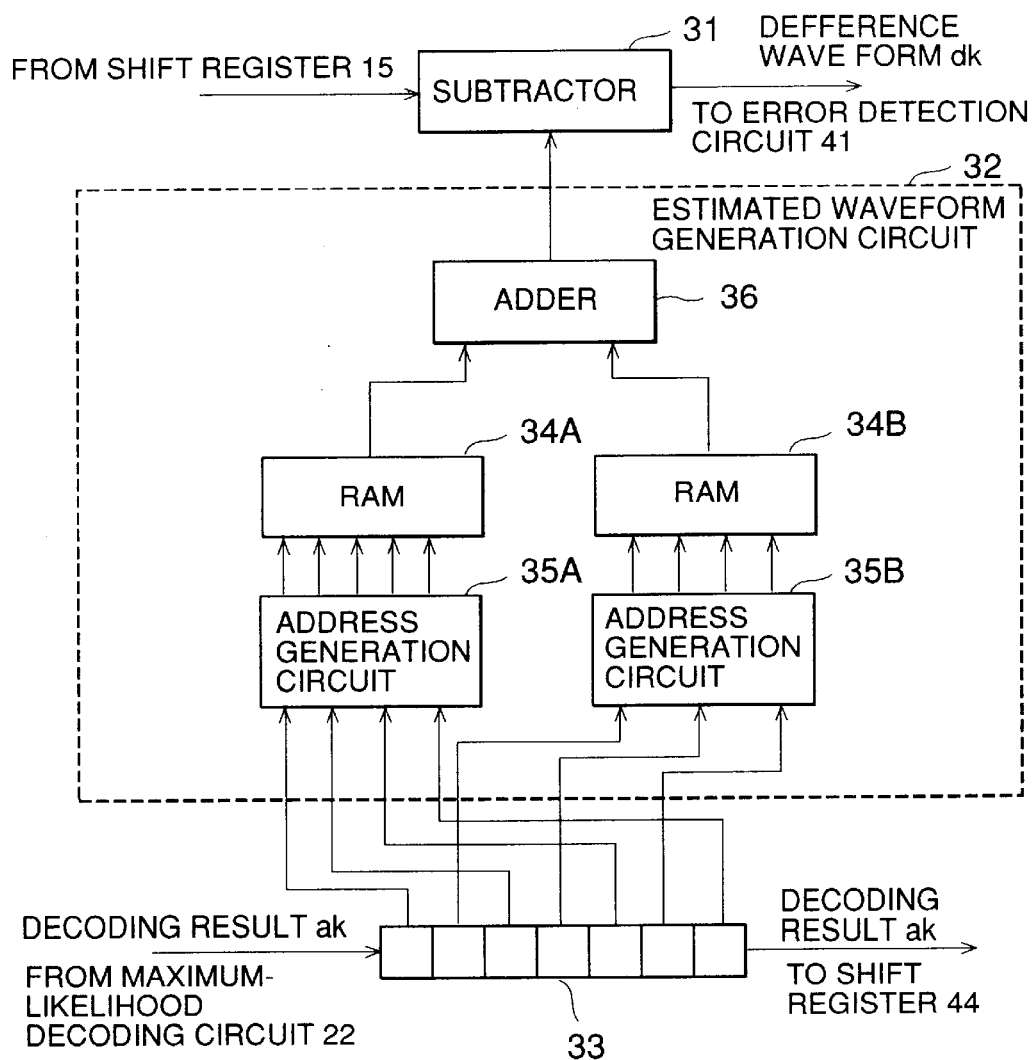
FIG. 3 is a block diagram for explaining details of a difference waveform generation section.
Figure 7A:
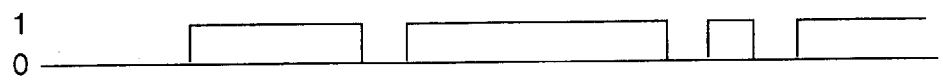
FIG. 7A to 7H are waveform charts in processing of parts in an error pattern discrimination circuit.
Figure 7B:
Figure 7C:
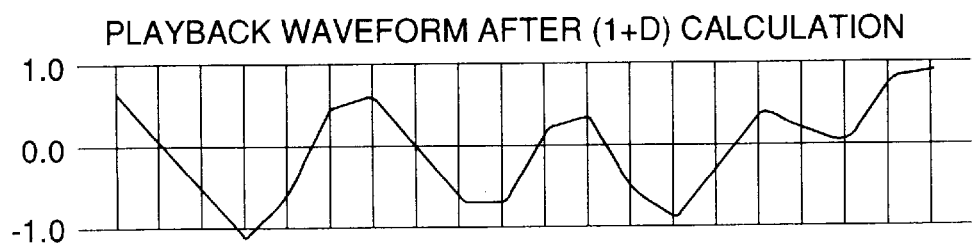
Figure 7D:
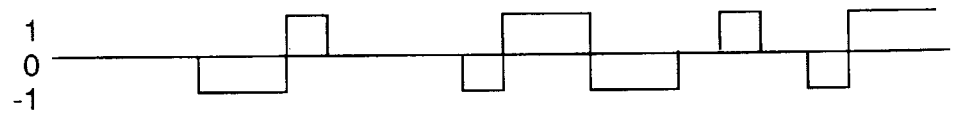
Figure 7E:
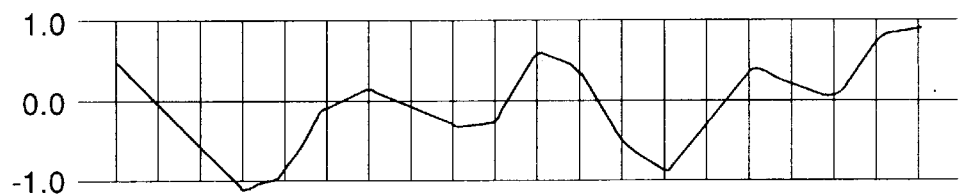

Next, the difference waveform generation section 30 according to the embodiment will be discussed in detail. FIG. 3 is a detailed block diagram of the difference waveform generation section 30. FIGS. 7A to 7H are waveform charts when an error occurs upon digital magnetic recording; FIG. 7A shows an example of NRZ code of code sequence recorded on recording media, FIG. 7B an example of INRZI code of intermediate code, FIG. 7C playback waveform after (1+D) calculation $y_k$, FIG. 7D decoding result by PRML, FIG. 7E estimated waveform $x_k$, FIG. 7F difference waveform $d_k$, FIG. 7G an example of sum-of-product waveform $r_k$, and FIG. 7H decoding result after error correction.

In FIG. 3, the estimated waveform generation circuit 32 has RAMs 34A and 34B for relating ideal waveform data containing no noise to bit data and storing the data, address generation circuits 35A and 35B for generating addresses from bit data and indicating the addresses for the RAMs 34A and 34B, and an adder 36 for adding waveform data read from the RAMs 34A and 34B together for generating an estimated waveform. The estimated waveform generation circuit 32 generates addresses from the bit data of the decoding result $a_k$, reads waveform data from the RAMs 34A and 34B, and adds the waveform data together, thereby generating an estimated waveform, whereby an ideal waveform containing no noise is generated.

Here, the address generation circuits 35A and 35B will be discussed in detail. The decoding result of the maximum-likelihood decoding circuit 22 has regularity based on alternation of magnetic transition for each of even and odd bits of the decoding result. That is, 1 and −1 (except 0) appear alternately in sequences of odd and even bits of the decoding result. Using this characteristic feature, a 3-bit pattern can be represented by a 4-bit address and a 4-bit pattern by a 5-bit address in the sequences of odd and even bits. For example, FIG. 4 shows addresses for 3-bit patterns. There are fifteen bit patterns of decode values taken out every other bit from the shift register 33. If the value of the leftmost bit, disregarding any 0, is 1, the leftmost bit value of the address signal is set to 0 and if the value of the leftmost bit, disregarding any 0, is −1, the leftmost bit value of address signal is set to 1. The values of other address bits (three right digits) are set to 1 if the value of the corresponding bit pattern bit is 1 or −1, and set to 0 if 0, for generating the address signal. Thus, the bit pattern of a decode value of three consecutive bits of odd or even bits interleaved can be represented by a 4-bit address signal. Likewise, the bit pattern of an n-bit decode value can be represented by an (n+1)-bit address signal.

FIG. 19 shows an example of data stored in the RAM 34A, 34B, wherein 3-bit pattern examples are given and each data item is related to a 4-bit address and is represented by a 6-bit word length. The RAMs 34A and 34B previously store values of ideal waveforms containing no noise (value of playback signal in each bit found considering intersymbol interference from the surrounding bits) corresponding to bit patterns of the decoding result. The value of the estimated waveform in the kth bit, $x_k$, is given as shown in Expression 2:

$$X_k = \sum_{i=-2s}^{2s} a_{k+i} \cdot h_i + \sum_{i=-2s+1}^{2s-1} a_{k+i} \cdot h_i \quad \text{Expression 2}$$

where $a_{k+1}$: Decode value of (k+i)th bit (−1, 0, +1)

$h_i$: Value of isolated waveform at position 1 bit away from the center

As shown in Expression 2, the value of a playback signal in each bit is found in each of even and odd sequences considering intersymbol interference from the surrounding bits, and the found value is stored in the RAM.

In FIG. 3, the decoding result interleaved as odd bits and even bits in the maximum-likelihood decoding circuit 22 is sent to the shift register 33 as one stream. The shift register 33 shifts the maximum-likelihood decoding result (ternary data of +1, 0, −1) as it is, and outputs it to the shift register 44 in the error discrimination and correction section 40 at the next stage.

The address generation circuits 35A and 35B generate addresses for the RAMs 34A and 34B from the decoding result of every other bit of the shift register 33. The record data corresponding to the address signal generated by the address generation circuits 35A and 35B is read from the RAMs 34A and 34B. The adder 36 adds together values read from the RAMs 34A and 34B for finding the estimated waveform value.

The subtractor 31 subtracts the estimated waveform value output by the adder 36 from output of the (1+D) arithmetic circuit 14 transmitted after timing recovery (delay) via the shift register 15, thereby generating a difference waveform signal. That is, the difference waveform value in the kth bit, $d_k$, is represented as shown in Expression 3:

$$d_k = y_k - x_k \quad \text{Expression 3}$$

where $y_k$: Playback waveform value after (1+D)

The difference waveform signal found in the subtractor 31 is transmitted to the error detection circuit 41.

Since a playback signal containing noise is amplified in the equalization circuit 21, the maximum-likelihood decoding circuit 22 may output the decoding result containing an error caused by the noise. To detect a decoding error in the maximum-likelihood decoding circuit 22, the embodiment generates an ideal waveform containing no noise from the decoding result and compares the generated waveform with the playback signal for checking to see if the maximum-likelihood decoding circuit 22 performs correct decoding.

Figure 18:
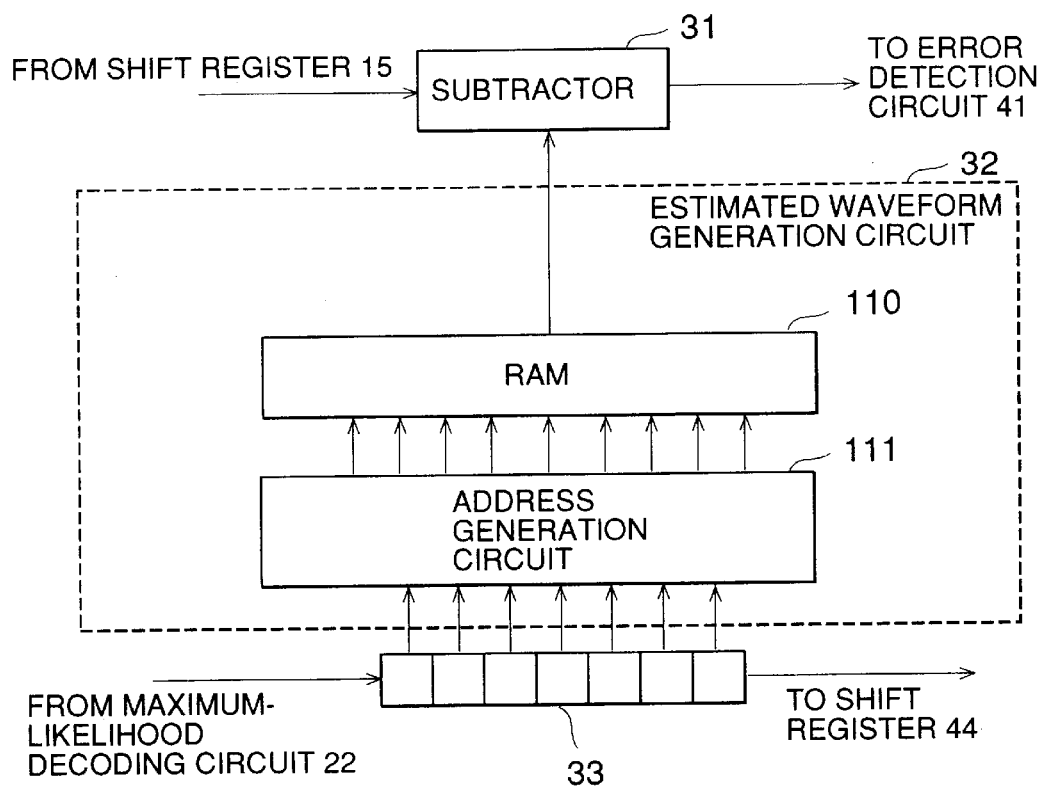
FIG. 18 is a block diagram of another difference waveform generation section example.

Although the RAMs 34A and 34B are provided separately for odd bits and even bits in FIG. 3, the estimated waveform generation circuit 32 may comprise one RAM 110 and one address generation circuit 111 as shown in FIG. 18, wherein the address generation circuit 111 converts decode data used for waveform estimation into addresses in batches and corresponding waveform estimation data is read from the RAM 110, whereby the number of RAMs can be reduced.

Next, the configuration and operation of the error discrimination and correction section 40 will be discussed in detail.

As shown in FIG. 1, the error discrimination and correction circuit 40 comprises the error detection circuit 41 for detecting an error and error position, the error pattern discrimination circuit 42 for discriminating the type of error, the error correction circuit 43 for correcting the error, and the shift register 44.

Figure 6:
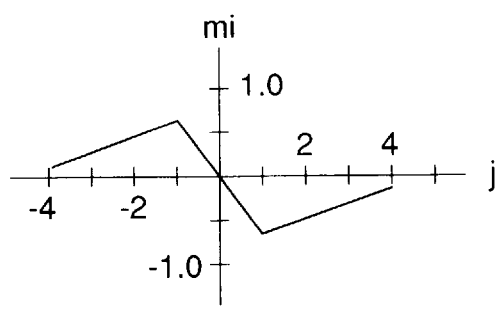
FIG. 6 is an illustration showing an example of an error pattern.
Figure 23:
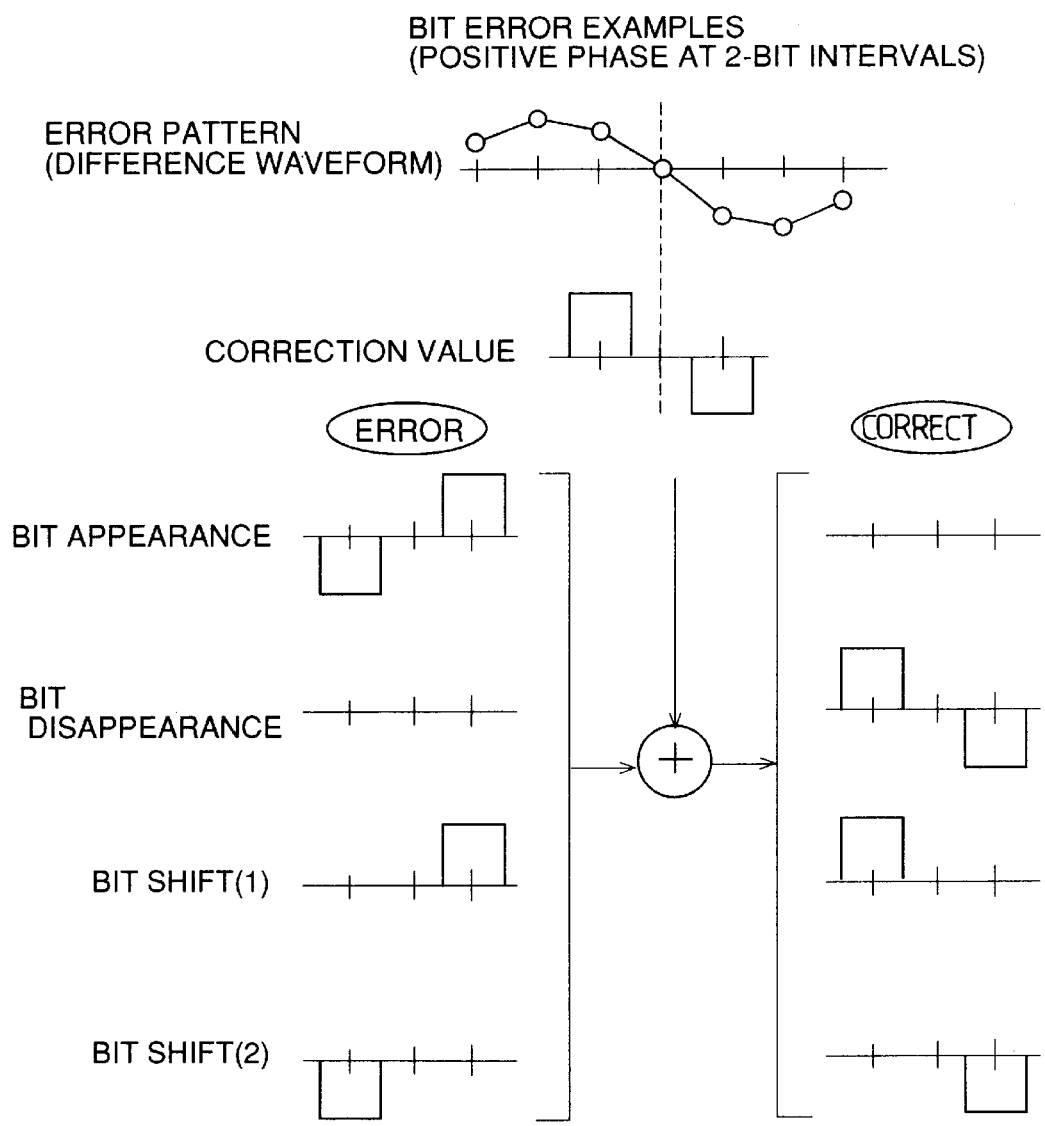
FIG. 23 is an illustration showing bit errors.

Since an error occurs in a bit pair in the PRML system, error bits occur as a bit pair at intervals of 2-, 4-, 6-, 8-, . . . bits; for example, the difference waveform when an error occurs at 2-bit intervals takes a waveform as shown in FIGS. 6 and 23 (the phase of the waveform will be hereinafter referred to as a positive phase (P)) or a waveform of an opposite phase to the waveform as shown in FIGS. 6 and 23 (the phase of the waveform will be hereinafter referred to as a negative phase (N)). For the waveform of the positive phase, with one bit at the kth clock as the center, the difference waveform value is positive at the bit at the (k−1)st clock and negative at the bit at the (k+1)st clock. FIG. 6 shows the difference waveform when an error occurs at 2-bit intervals. FIG. 23 shows the difference waveform when an error occurs at 2-bit intervals and bit patterns of the error at the time.

In the embodiment, the error detection circuit 41 uses the difference waveform when an error occurs as an error discrimination pattern and performs product sum calculation with the difference waveform found in the subtractor 31. As a result of the product sum calculation, amplitude variation is found and if it is large, it can be considered that an error occurs.

The error pattern discrimination circuit 42 compares the product sum value $r_k$ with two predetermined different thresholds $c_1$ and $c_2$ described below for determining whether the error is an error at a 2-bit or 4-bit interval. The difference waveform amplitude when an error occurs at a 4-bit interval, $d_k$, becomes larger than that when an error occurs at a 2-bit interval because of intersymbol interference. The sum-of-product value $r_k$ is proportional to the difference waveform amplitude $d_k$. This fact is used as follows: The first threshold $c_2$ and the second threshold $c_1$ less than the first threshold are predetermined and if the value found by sum-of-product calculation, $r_k$, is greater than the first threshold, it is determined that the error is an error at a 4-bit interval; if the value found by sum-of-product calculation is less than the first threshold and greater than the second threshold, it is determined that the error is an error at a 2-bit interval. Alternatively, the difference waveform amplitude $d_k$ rather than the value found by sum-of-product calculation, $r_k$, may be compared with the first and second thresholds.

When an error occurs, it is determined whether or not the difference waveform is a positive or negative phase, thereby determining a correction pattern in the error correction circuit 43.

Further, bit errors at 2-bit intervals in the PRML system are classified into four patterns of bit appearance, bit disappearance, bit shift (1), and bit shift (2) for the positive phase, as shown in FIGS. 12 and 23. The error pattern discrimination circuit 42 decides which of the error bit patterns the error corresponds to for determining the error pattern for correction. The error correction circuit 43 adds a correction value as shown in FIG. 23 and decoded data at the error position for correcting the error. Likewise, bit errors at 4-bit intervals are also classified into four bit error patterns and the error pattern discrimination circuit 42 decides which of the error bit patterns the error corresponds to.

Figure 5:
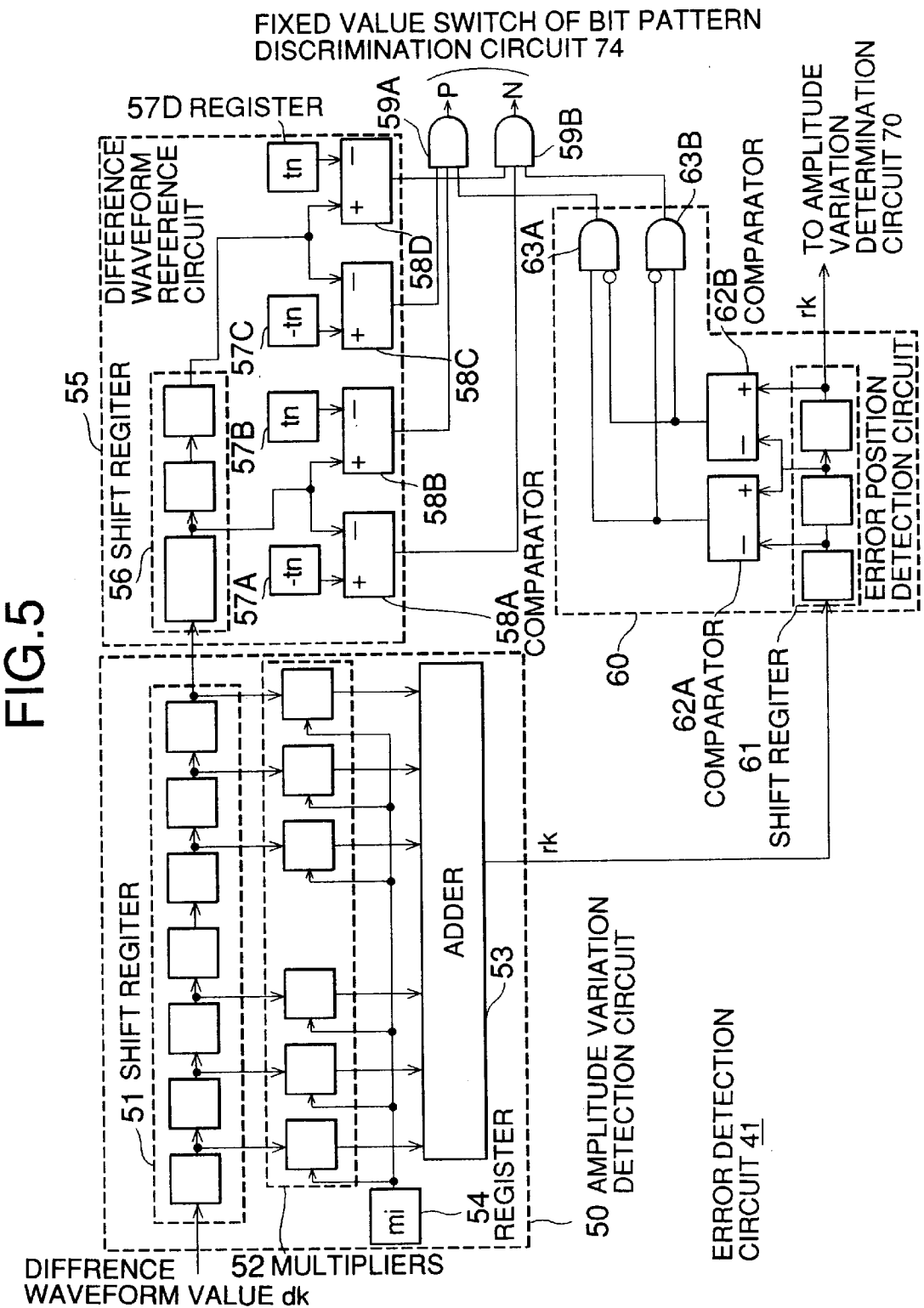
FIG. 5 is a circuit diagram explaining details of an error detection circuit.

First, the error detection circuit 41 will be discussed in detail. FIG. 5 is a block diagram of the error detection circuit 41. The error detection circuit 41 comprises an amplitude variation detection circuit 50 for calculating a sum-of-product value $r_k$ of a difference waveform value $d_k$ and error discrimination pattern, a difference waveform reference circuit 55 for determining a threshold for the difference waveform value $d_k$, and an error position detection circuit 60 for detecting an error position using the sum-of-product value. The amplitude variation detection circuit 50 calculates a sum-of-product of an error discrimination pattern and a difference waveform found from the decoding result. The error position detection circuit 60 determines whether the phase is positive or negative. The difference waveform reference circuit 55 compares the difference waveform with thresholds.

The circuit parts of the error detection circuit 41 will be discussed in detail with reference to FIG. 5.

In FIG. 5, the amplitude variation detection circuit 50 comprises a shift register 51 for temporarily storing a difference waveform value, a multiplier array 52 for multiplying an error discrimination pattern by the difference waveform value, a register 54 for holding the error discrimination pattern, and an adder 53 for adding outputs of the multiplier array 52. The multiplier array 52 multiplies a difference waveform $d_k$ sent from the subtractor 31 of the difference waveform generation circuit 30 by the contents of the constant register 54 storing a predetermined value $m_i$ and the adder 53 finds the sum total of outputs of the multipliers. The error discrimination pattern becomes a waveform as shown in FIGS. 6 and 23. For example, the error discrimination pattern is assumed to be $m_i$ and the sum of products of $m_i$ and difference waveform is calculated. If the amplitude variation is large, an error can be assumed to have occurred. The amplitude variation detection circuit 50 outputs the sum-of-product value $r_k$ as shown in Expression 4 from the adder 53.

$$r_k = \sum_{\substack{i=-p \\ (i \neq 0)}}^{p} d_{k+1} \cdot m_i \qquad \text{Expression 4}$$

where $d_{k+i}$: Difference waveform value of (k+i)th bit $m_i$: Given value representing error discrimination pattern FIG. 6 shows an example of the given value $m_i$ representing the error discrimination pattern stored in the constant register 54. The error discrimination pattern in the example shown in FIG. 6 is generated based on an error waveform when an error occurs at a 2-bit interval (bit number difference is two) in positive phase with normalized linear density K being 3.0 during magnetic recording. To generate the error discrimination pattern, instead of using the difference waveform when an error occurs at a 2-bit interval in positive phase as shown in FIG. 6, a difference waveform when an error occurs at a 4-bit interval in positive phase may be used or a difference waveform when an error occurs at a 2- or 4-bit interval in negative phase may be used. To use the difference waveform when an error occurs at a 4-bit interval, the threshold in an amplitude variation determination circuit 70 at the following stage becomes a different value from the threshold applied when an error occurs at a 2-bit interval; for example, it is determined considering the maximum value of amplitude variation.

Thus, the amplitude variation detection circuit 50 calculates the sum of products of the error discrimination pattern and the difference waveform found from the decoding result.

Next, the error position detection circuit 60 and the difference waveform reference circuit 55 will be discussed.

First, positive and negative phases of error patterns will be described with reference to FIGS. 8A and 8B.

The error position detection circuit 60 and the difference waveform reference circuit 55 determine two states of (a) positive phase and (b) negative phase, as shown in FIGS. 8A and 8B and if the state is satisfied, determine that an error occurs.

Figure 7F:
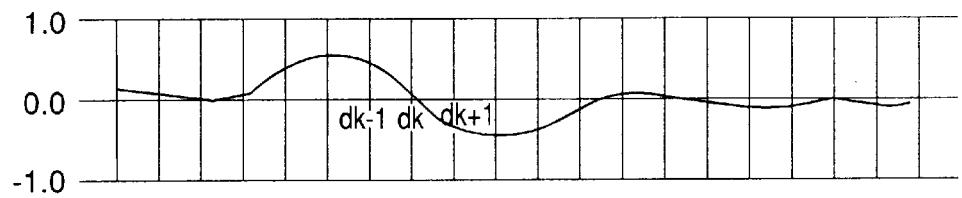
Figure 7G:
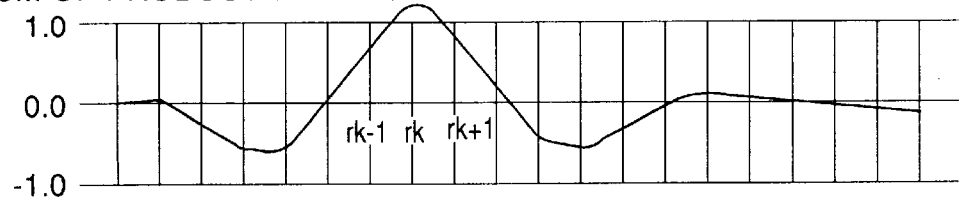
Figure 7H:
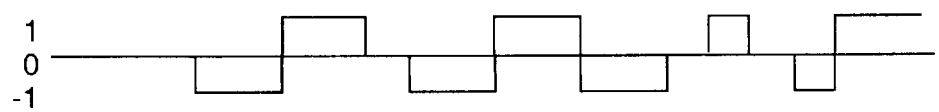

In FIGS. 8A and 8B, in (1), the sum-of-product value $r_k$ is compared with the sum-of-product value preceding $r_k$ and the sum-of-product value following $r_k$. Whether or not $r_k$ is a peak value is determined depending on whether or not $r_k$ is greater than them both, as shown in FIG. 7G. In (2), when the absolute values of the difference waveforms preceding and following the difference waveform $d_k$ are greater than the predetermined threshold $t_h$ as shown in FIG. 7F, it is decided that an error occurs.

The error position detection circuit 60 and the difference waveform reference circuit 55 are circuits for determining (1) and (2) of the conditions shown in FIGS. 8A and 8B. The error position detection circuit 60 makes a decision shown in (1) in FIGS. 8A and 8B and the difference waveform reference circuit 55 makes a decision shown in (2) in FIGS. 8A and 8B. As a result of the decisions, if both (1) and (2) in FIGS. 8A and 8B for positive phase error are satisfied, a positive phase error is assumed to occur; if both (1) and (2) in FIG. 8A and 8B for negative phase error are satisfied, a negative phase error is assumed to occur. More accurate error detection can be made using the determination results of the error position detection circuit 60 and the difference waveform reference circuit 55.

First, the difference waveform reference circuit 55 will be discussed in detail. The difference waveform reference circuit 55 uses comparators 58A, 58B, 58C, and 58D for comparing difference waveform values $d_{k+1}$ and $d_{k-1}$ at 2-bit intervals subjected to timing recovery by a shift register 56 with values stored in registers 57A to 57D. Each of the comparators compares a value input to a minus (−) terminal with a value input to a plus (+) terminal and if the value input to the +terminal is greater than the value input to the −terminal, outputs 1; otherwise, it outputs 0. The predetermined threshold $t_h$ is a positive value and $-t_h$ is stored in the registers 57A and 57C and $t_h$ is stored in the registers 57B and 57D. Therefore, if the relation as shown in Expression 5 is satisfied, 1 is output from the comparator 58A, 58B, 58C, 58D; otherwise, 0 is output.

$$d_{k+1} \leq -t_h, \ d_{k+1} \geq t_h, \ d_{k-1} \leq -t_h, \ d_{k-1} \geq t_h \qquad \text{Expression 5}$$

If no error occurs, the difference waveform is almost 0. Therefore, $t_h$ is set to, for example, a value of about one eighth of the maximum peak value of the difference waveform and if the absolute value of the difference waveform is greater than the fixed value, it is determined to be an error position, whereby the decision of (2) shown in FIGS. 8A and 8B is made.

Next, the error position detection circuit 60 will be discussed in detail. The error position detection circuit 60 uses comparators 62A and 62B for comparing sum-of-product waveforms $r_{k+1}$, $r_k$, and $r_{k-1}$ at 2-bit intervals subjected to timing recovery by a shift register 61, namely, comparing $r_k$ with the sum-of-product values preceding and following $r_k$. As a result, if the relation as shown in Expression 6 is satisfied, 1 is output from the comparator 62A, 62B; otherwise, 0 is output, whereby the determination results of the conditions as shown in (1) in FIG. 8A and 8B can be obtained.

$$r_{k+1} \leq r_k, r_k \leq r_{k-1} \qquad \text{Expression 6}$$

If positive and negative phase errors occur, 1 is output from logical elements 59A and 59B respectively by combining outputs of the difference waveform reference circuit 55 and the error position detection circuit 60. Outputs of the comparators 62A and 62B are combined and the determination results of the conditions shown in FIGS. 8A and 8B are obtained and input to logical elements 63A and 63B, which then output positive or negative phase error. A more accurate error position can be detected from combinations of outputs of the difference waveform reference circuit 55 and the error position detection circuit 60.

Figure 9:
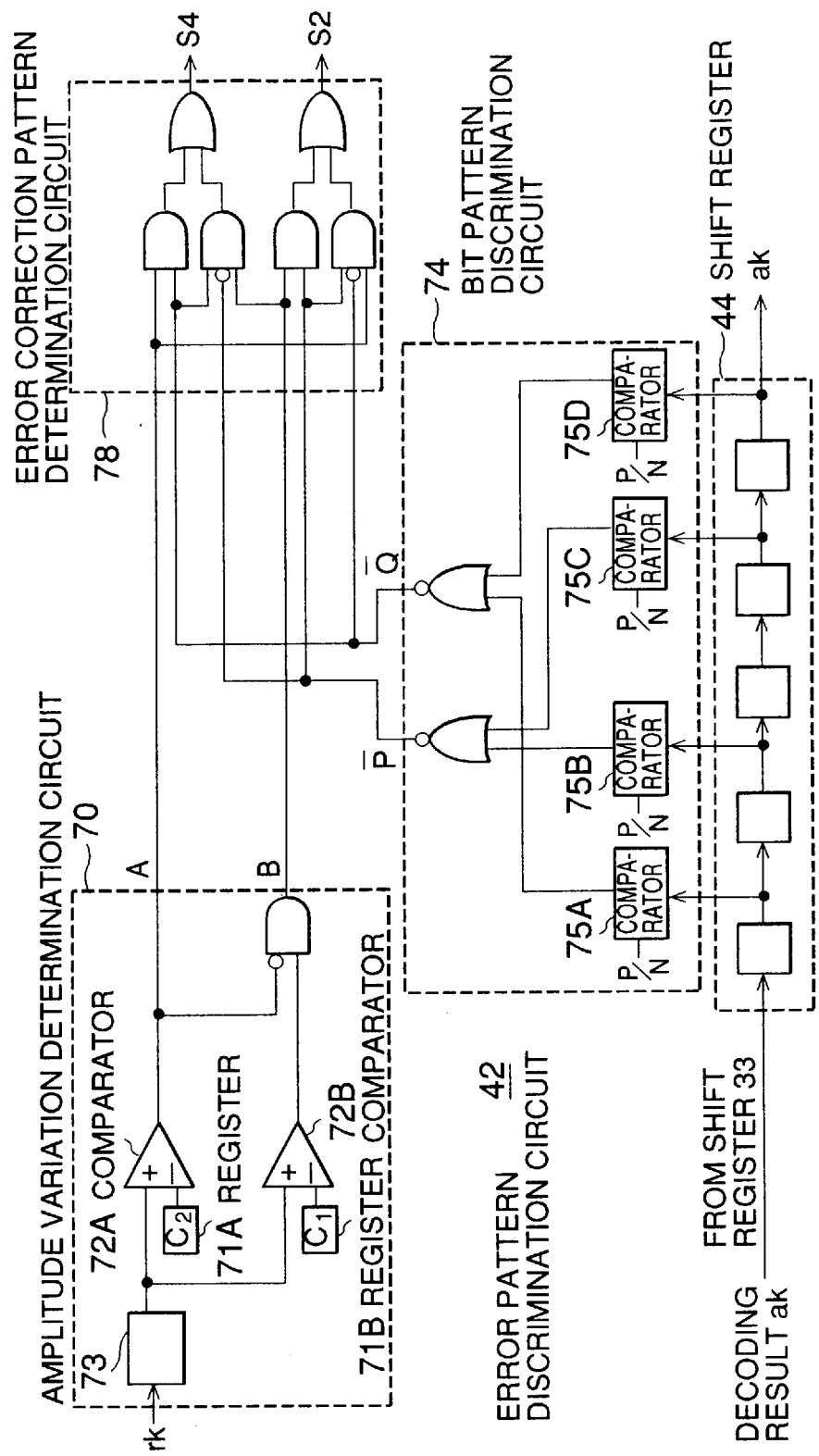
FIG. 9 is a circuit diagram showing a configuration example of the error pattern discrimination circuit.

Next, the error pattern discrimination circuit 42 will be discussed in detail. FIG. 9 shows a block diagram of the error pattern discrimination circuit 42.

In FIG. 9, the error pattern discrimination circuit 42 comprises the amplitude variation determination circuit 70 for determining amplitude variation, a bit pattern discrimination circuit 74 for discriminating an error bit pattern, and an error correction pattern determination circuit 78 for determining an error pattern to be corrected. The amplitude variation determination circuit 70 determines the amplitude variation described above and the bit pattern discrimination circuit 74 determines whether the error is an error at a 2-bit or 4-bit interval, from the decoding result. The error correction pattern determination circuit 78 determines the error pattern to be corrected based on whether or not the error is an error at a 2-bit or 4-bit interval and whether or not the error pattern is positive or negative.

In FIG. 9, the amplitude variation determination circuit 70 determines whether or not the error is an error at a 2-bit or 4-bit interval using the fact that when an error at a 4-bit interval occurs, intersymbol interference is smaller than that when an error at a 2-bit interval occurs and thus the waveform area increases and can be determined using the sum-of-product value. The amplitude variation determination circuit 70 presets a first threshold $c_2$ in a register 71A and a second threshold $c_1$ in a register 71B ($c_2 \geq c_1 \geq 0$). The absolute value of the sum-of-products value, $|r_k|$, is compared with the given values stored in the registers 71A and 71B by comparators 72A and 72B. If the absolute value of the sum-of-products value, $|r_k|$, is equal to or greater than the threshold $c_2$, the error is determined to be an error at a 4-bit interval; if the former is less than the latter, the error is determined to be an error at a 2-bit interval. At that time, if $r_k \leq 0$, a sign inversion circuit 73 inverts the sum-of-products value $r_k$ as $-r_k$.

The bit pattern discrimination circuit 74 checks to see if the bit pattern of the decoding result subjected to timing recovery by the shift register 44 satisfies a given condition.

The values to be compared by comparators 75A and 75B and 75C and 75D are changed depending on the outputs of the error detection circuit 41 at the preceding stage, P and N. When P=1 (N=0), each of comparators 75A and 75B makes an equality comparison between a given bit value and 1, and each of comparators 75C and 75D makes an equality comparison between a given bit value and −1. On the other hand, when N=1 (P=0), each of comparators 75A and 75B makes an equality comparison between a given bit value and −1 and each of comparators 75C and 75D makes an equality comparison between a given bit value and 1. When a positive phase error occurs, any of the four error patterns is taken as shown in FIGS. 12 and 23. Thus, when the decoding result bits show the error pattern at 2-bit intervals, $\overline{P}$ output goes high. At this time, when output B from the amplitude variation determination circuit 70, is high (when the amplitude variation is less than the first threshold and is greater than the second threshold), the error correction pattern determination circuit 78 makes S2 output high. Likewise, when the decoding result bits show a positive phase error pattern at 4-bit interval, $\overline{Q}$ output goes high. When output A from the amplitude variation determination circuit 70, is high (the amplitude variation is greater than the first threshold), the error correction pattern determination circuit 78 makes S4 output high.

The error correction pattern determination circuit 78 combines outputs of the amplitude variation determination circuit 70 and the bit pattern discrimination circuit 74 and determines whether the decoding result is to be corrected at 2-bit or 4-bit intervals. More accurate error bit intervals can be determined by combining the outputs of the amplitude variation determination circuit 70 and the bit pattern discrimination circuit 74.

The results output from the error correction pattern determination circuit 78 are summarized as follows:

(a) Positive phase bit error (P=1, N=0)

The amplitude variation determination circuit 70 determines whether or not a given sum-of-products value satisfies the conditions shown in Expression 7: If the sum-of-products value is equal to or greater than the threshold $c_2$, the error is determined to be an error at a 4-bit interval; if the sum-of-products value is less than the threshold $c_2$ and is equal to or greater than the threshold $c_1$, the error is determined to be an error at a 2-bit interval.

$$A: r_k \geq c_2$$
$$B: c_2 > r_k \geq c_1 \qquad \text{Expression 7}$$

The bit pattern discrimination circuit 74 determines whether or not a given bit pattern satisfies the conditions shown in Expression 8, namely, whether it takes a positive phase error pattern:

$$P: a_{k+1}=1 \text{ or } a_{k-1}=-1$$
$$Q: a_{k+2}=1 \text{ or } a_{k-2}=-1 \qquad \text{Expression 8}$$

At this time, output of the error correction pattern determination circuit 78 becomes as shown in Expression 9:

$$S4=(A+BP)\overline{Q}$$
$$S2=(B+AQ)\overline{P} \qquad \text{Expression 9}$$

As shown in Expression 9, when it is determined that a positive phase error at a 2-bit interval occurs, and correction as shown in FIG. 23 can be made at 2-bit intervals, or when, although it is determined that a positive phase error at a 4-bit interval occurs, correction as shown in FIG. 23 cannot be made at 4-bit intervals, the error correction pattern determination circuit 78 makes correction signal S2 high so as to correct the error at 2-bit intervals.

In contrast, when it is determined that a positive phase error at a 4-bit interval occurs, and correction as shown in FIG. 23 can be made at 4-bit intervals, or when, although it is determined that a positive phase error at a 2-bit interval occurs, correction as shown in FIG. 23 cannot be made at 2-bit intervals, the error correction pattern determination circuit 78 makes correction signal S4 high so as to correct the error at 4-bit intervals.

For example, if the error detection circuit 41 and the amplitude variation determination circuit 70 at the preceding stage determine that a positive phase error at a 2-bit interval occurs, an error pattern other than the four patterns as shown in FIG. 23 may also occur. In this case, since the error cannot be corrected, when the error pattern other than the four patterns is detected, the error is corrected at 4-bit intervals. This also applies to errors at 4-bit intervals. Normally, the fact that errors at 2-bit and 4-bit intervals occupy about 99% of all errors which occur, and the fact that when the error cannot be corrected at 2-bit intervals there is a very high probability that it will be able to be corrected at 4-bit intervals, and that when the error cannot be corrected at 4-bit intervals there is a very high probability that it will be able to be corrected at 2-bit intervals, can be found statistically by simulation. Therefore, such processing is performed.

(b) Negative phase bit error (P=0, N=1)

The amplitude variation determination circuit 70 determines whether or not a given sum-of-products value satisfies the conditions shown in Expression 10: If the sum-of-products value is less than the threshold $-c_2$, the error is determined to be an error at a 4-bit interval; if the product sum value is greater than the threshold $-c_2$ and is less than the threshold $-c_1$, the error is determined to be an error at a 2-bit interval.

$$A: r_k \leq -c_2$$

$$B: -c_2 < r_k \leq -c_1 \qquad \text{Expression 10}$$

The bit pattern discrimination circuit 74 determines whether or not a given bit pattern satisfies the conditions shown in Expression 11, namely, whether it takes a negative phase error pattern:

$$P: a_{k+1} = -1 \text{ or } a_{k-1} = 1$$

$$Q: a_{k+2} = -1 \text{ or } a_{k-2} = 1 \qquad \text{Expression 11}$$

At this time, output of the error correction pattern determination circuit 78 becomes as shown in Expression 12:

$$S4 = (A + BP)\overline{Q}$$

$$S2 = (B + AQ)\overline{P} \qquad \text{Expression 12}$$

As shown in Expression 12, when it is determined that a negative phase error at a 2-bit interval occurs, and correction as shown in FIG. 23 can be made at 2-bit intervals, or when, although it is determined that a negative phase error at a 4-bit interval occurs, correction as shown in FIG. 23 cannot be made at 4-bit intervals, the error correction pattern determination circuit 78 makes correction signal S2 high so as to correct the error at 2-bit intervals.

In contrast, when it is determined that a negative phase error at a 4-bit interval occurs, and correction as shown in FIG. 23 can be made at 4-bit intervals, or when, although it is determined that a negative phase error at a 2-bit interval occurs, correction as shown in FIG. 23 cannot be made at 2-bit intervals, the error correction pattern determination circuit 78 makes correction signal S4 high so as to correct the error at 4-bit intervals.

For example, if the error detection circuit 41 and the amplitude variation determination circuit 70 at the preceding stage determine that a negative phase error at 2-bit interval occurs, an error pattern other than the four patterns as shown in FIG. 23 may also occur. In this case, since the error cannot be corrected, when the error pattern other than the four patterns is detected, the error is corrected at 4-bit intervals. This also applies to errors at 4-bit intervals.

In any case, the error correction circuit 43 corrects the decoding result at 4-bit intervals when S4=1 (S2=0) and corrects the decoding result at 2-bit intervals when S2=1 (S4=0).

When a positive phase error occurs at a 2-bit interval, the error correction circuit 43 adds positive phase correction values at 2-bit intervals for correction as shown in FIG. 23; when a positive phase error occurs at a 4-bit interval, the error correction circuit 43 adds positive phase correction values at 4-bit intervals for correction. Also, when a negative phase error occurs at a 2-bit interval, the error correction circuit 43 adds negative phase correction values at 2-bit intervals for correction; when a negative phase error occurs at a 4-bit interval, the error correction circuit 43 adds negative phase correction values at 4-bit intervals for correction.

Figure 10:
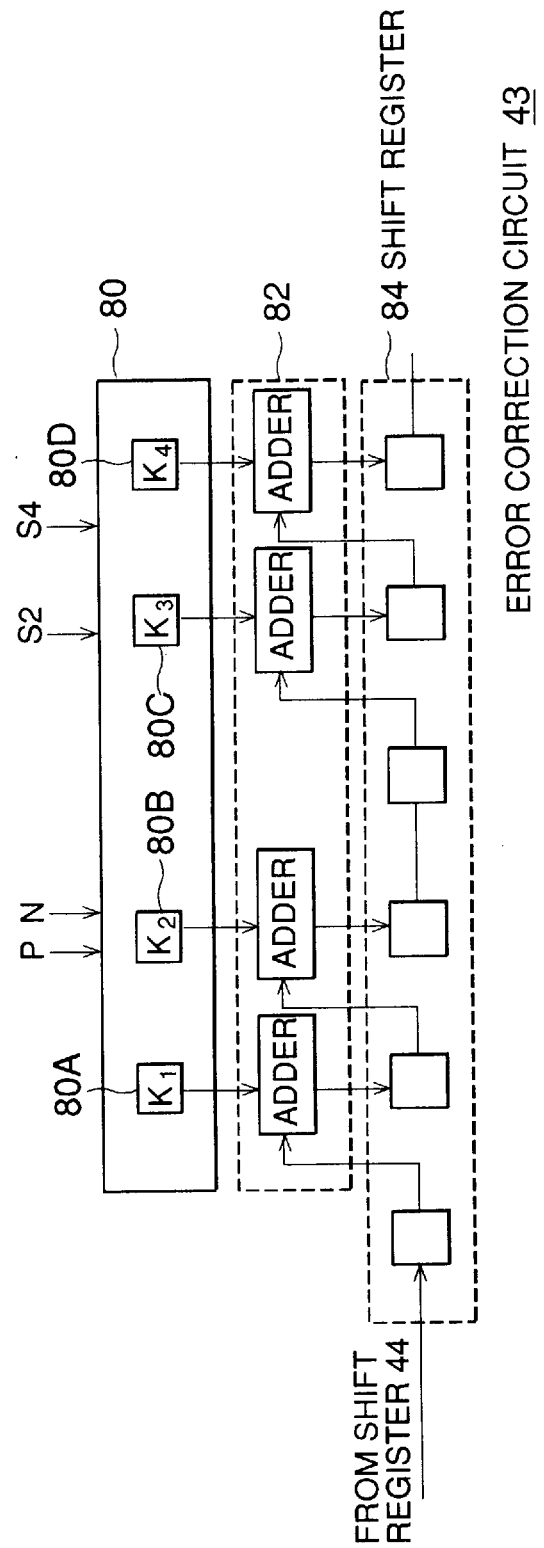
FIG. 10 is a circuit diagram explaining details of an error correction circuit.

Next, the error correction circuit 43 will be discussed in detail. FIG. 10 is a block diagram of the error correction circuit 43, which comprises registers 80, adders 82, and a shift register 84. Different values as described below are set in the registers 80 depending on the values of outputs P and N of the error detection circuit 41 and the values of outputs S2 and S4 of the error pattern discrimination circuit 42.

The error state contained in the 3-bit result decoded by PRML $(a_{k-1}, a_k, a_{k+1})$ can be classified as shown in FIGS. 23 and 12 if positive phase errors at 2-bit intervals are taken as an example, where * is arbitrary because it becomes a bit in another sequence interleaved. For any errors shown in FIG. 11, a new decoding result after correction may be set in the original decoding result, as shown in Expression 13:

$$a_{k-1} \leftarrow a_{k-1} + 1$$

$$a_{k+1} \leftarrow a_{k+1} - 1 \qquad \text{Expression 13}$$

Likewise, for positive phase errors at 4-bit intervals, a new decoding result after correction may be set in the original decoding result, as shown in Expression 14:

$$a_{k-2} \leftarrow a_{k-2} + 1$$

$$a_{k+2} \leftarrow a_{k+2} - 1 \qquad \text{Expression 14}$$

Likewise, for negative phase errors at 2-bit intervals, a new decoding result after correction may be set in the original decoding result, as shown in Expression 15:

$$a_{k-1} \leftarrow a_{k-1} - 1$$

$$a_{k+1} \leftarrow a_{k+1} + 1 \qquad \text{Expression 15}$$

Likewise, for negative phase errors at 4-bit intervals, a new decoding result after correction may be set in the original decoding result, as shown in Expression 16:

$$a_{k-2} \leftarrow a_{k-2} - 1$$

$$a_{k+2} \leftarrow a_{k+2} + 1 \qquad \text{Expression 16}$$

Therefore, assuming that the values set in the registers 80A, 80B, 80C, and 80D are K1, K2, K3, and K4 respectively, as listed in Table of FIG. 11, all error patterns can be corrected if the values are set as shown in Expression 17:

When $P=1$, $S4=1$: $K1=-1$, $K2=0$, $K3=0$, $K4=1$

When $P=1$, $S2=1$: $K1=0$, $K2=-1$, $K3=1$, $K4=0$

When $N=1$, $S4=1$: $K1=1$, $K2=0$, $K3=0$, $K4=-1$

When $N=1$, $S2=1$: $K1=0$, $K2=1$, $K3=-1$, $K4=0$      Expression 17

The registers 80 are configured so as to set K1–K4 from each input.

The adders 82 add the decode values and the values in the registers 80 and output the results to the shift register 84. For the outputs of the shift register 84, 1 and −1 are output as 1 while 0 is output intact, whereby the result decoded into record code (NRZ code) is obtained.

Thus, an error can be corrected by determining whether or not an error occurs, and if it occurs, determining the error position, and the error type. Since errors are corrected, the bit error rate can be lowered. In the PRML channel, without the need for complicated calculation, the sample value of an input analog signal encoded with GCR code is processed and decoding errors can be reduced.

Figure 13:
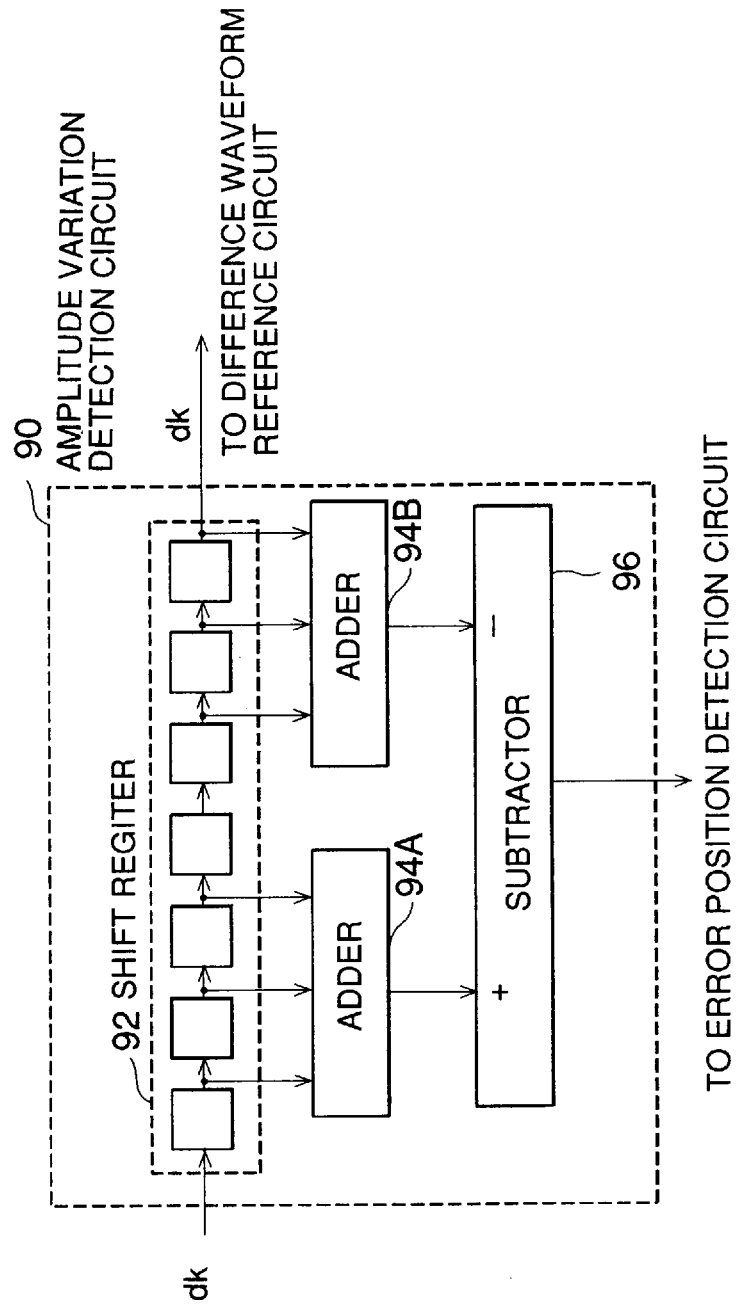
FIG. 13 is a block diagram showing another configuration example of the amplitude variation detection circuit 50 shown in FIG. 5.

Next, another configuration example of the amplitude variation detection circuit 50 shown in FIG. 5 will be discussed. The amplitude variation detection circuit 50 shown in FIG. 5 can also be made up of a shift register, adders, and a subtractor like an amplitude variation detection circuit 90 shown in FIG. 13. Assuming that the clock time is t, adders 94A and 94B add data of several bits preceding and following data $d_t$ at the clock time t from a data string of a difference waveform subjected to timing recovery by shift register 92. Subtractor 96 calculates, the difference between output data of the adders 94A and 94B and sends the result to the error position detection circuit 60. The amplitude variation detection circuit 90 shown in FIG. 13 is used in place of the amplitude variation detection circuit 50 in the configuration of the error detection circuit 41 shown in FIG. 5, whereby difference waveform variation can be discriminated without using the multipliers in the amplitude variation detection circuit 50. This can make the arithmetic circuit very simple and also enables high-speed processing.

In the embodiment, errors at 2-bit and 4-bit intervals are discriminated from each other for correction.

The configuration for detecting errors at intervals of 6-bits or more will be discussed with reference to FIGS. 24 and 25.

Figure 24:
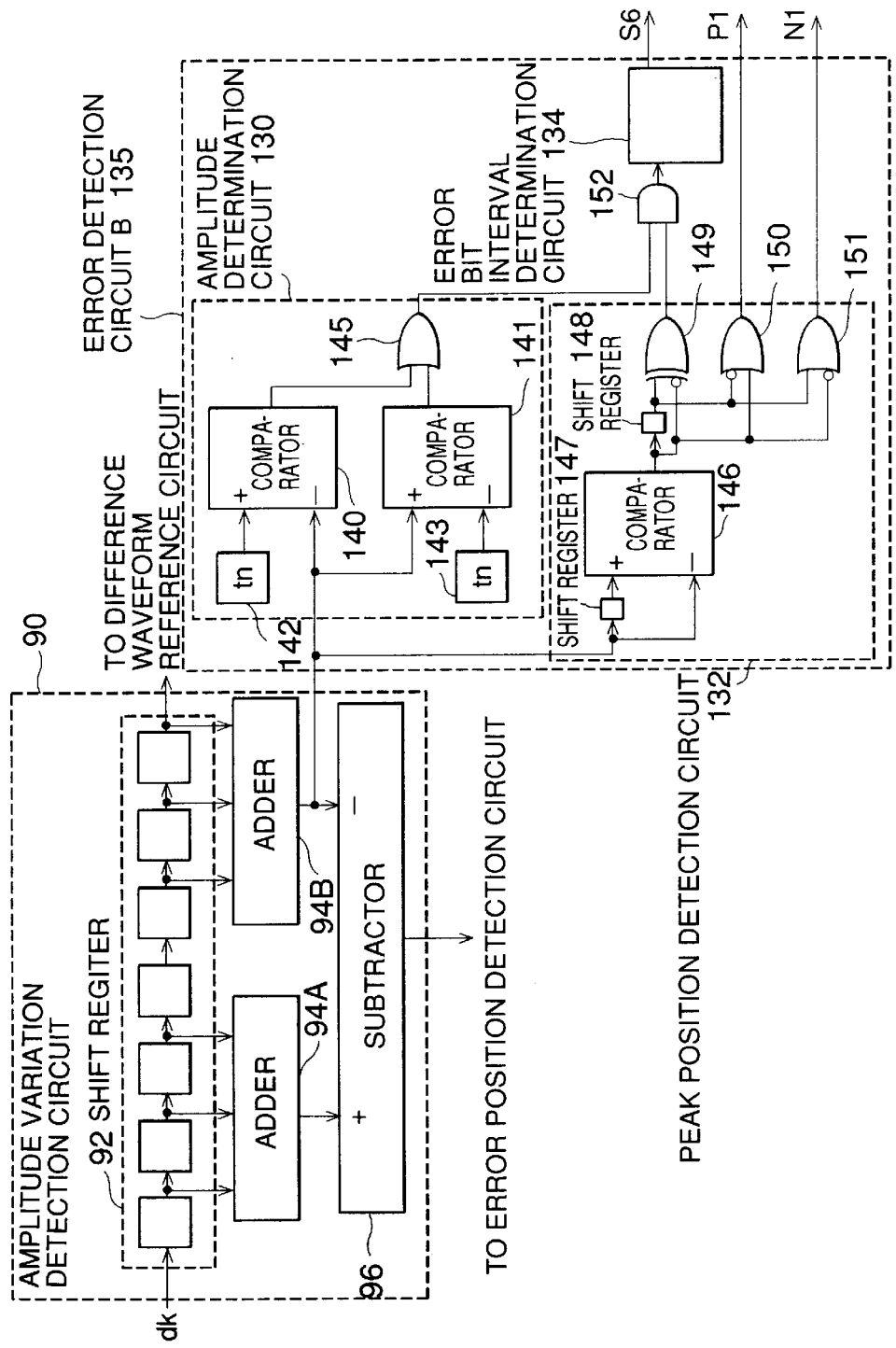
FIG. 24 is a circuit diagram showing the configuration of an error detection circuit at 6-bit or more intervals.

FIG. 24 shows an error detection circuit B 135 for detecting errors at intervals of 6-bits or more. In FIG. 24, the amplitude variation detection circuit 90 shown in FIG. 13 is used in place of the amplitude variation detection circuit 50 shown in FIG. 5 and the error detection circuit B 135 comprises an amplitude determination circuit 130 for determining whether or not the amplitude of a difference waveform has a given value or more, a peak position detection circuit 132 for detecting the bit position at which the difference waveform amplitude reaches the maximum, and an error bit interval determination circuit 134 for measuring the interval between the peak position detected by the peak position detection circuit 132 and the next peak position. The circuitry further determines error bit intervals of six bits or more and whether the phase is positive or negative. The error bit interval determination circuit 134 comprises a bit interval measuring counter.

The value to which three bits of difference waveform value $d_k$ are added in the amplitude variation detection circuit 90 is input to the amplitude determination circuit 130 and the peak position detection circuit 132. The amplitude determination circuit 130 determines whether or not the amplitude is a predetermined value or more. If the amplitude is a predetermined value or more, an error can be assumed to have occurred The peak position detection circuit 132 delays the value by one bit using a shift register 147, compares the value to which three bits of difference waveform value $d_k$ are added and the value to which three bits of the preceding difference waveform value $d_k$ are added, and further delays the comparison result using a shift register 148. When the comparison result at one time differs from the preceding comparison result, the peak position detection circuit 132 determines that the position is the peak position. Also, whether the phase is positive or negative is determined from the comparison result. If the amplitude determination circuit 130 determines that the amplitude is a predetermined value or more and the peak position detection circuit 132 determines that the amplitude has a peak value, the counter in the error bit interval determination circuit 134 is started and counts the bit interval between the peak position and the next peak position. If the bit interval is six bits or more, a signal S6 indicating the bit interval and signals P1 and N1 indicating the polarity of the error are output.

Figure 25:
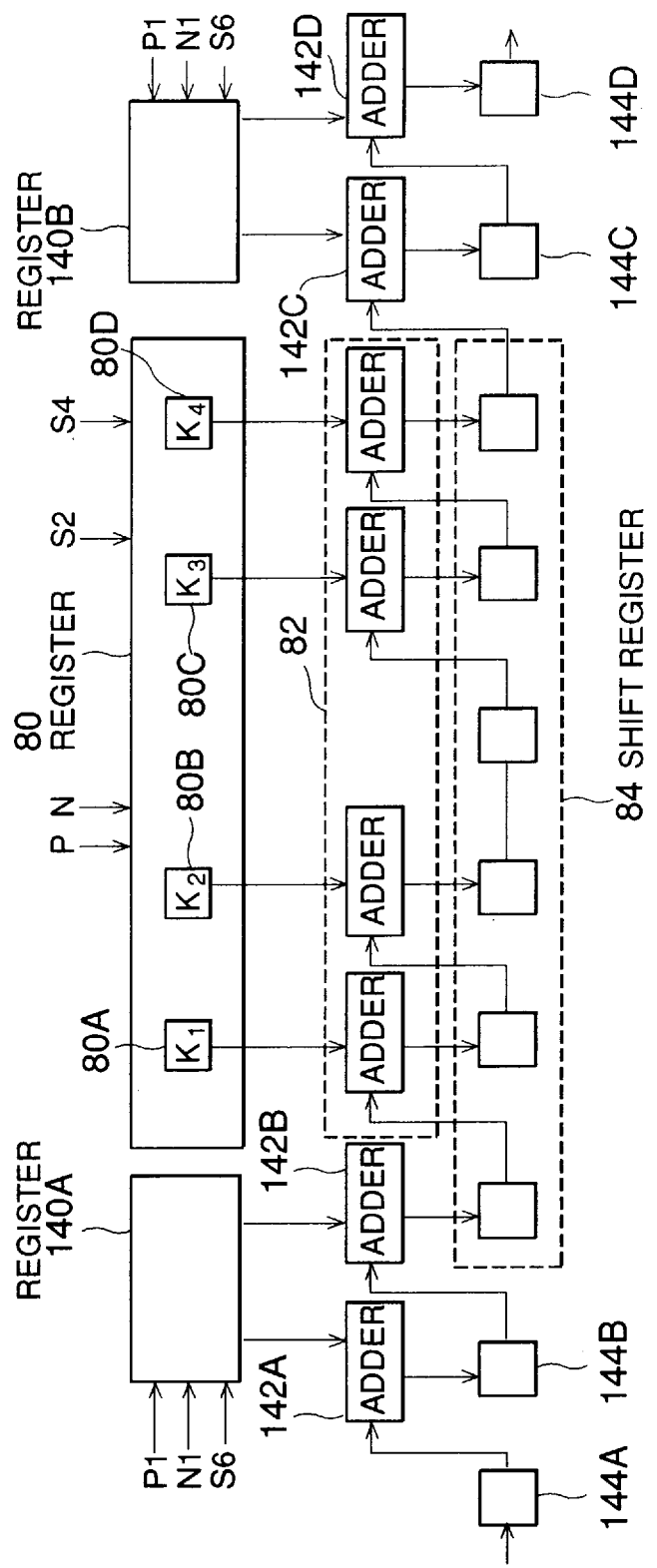
FIG. 25 is a circuit diagram explaining details of an error correction circuit at intervals of 6-bits or more.

FIG. 25 shows a correction circuit of errors at intervals of 6-bits or more. The error correction circuit shown in FIG. 25 is provided by adding a circuit for correcting errors at intervals of 6-bits or more to the error correction circuit shown in FIG. 10. The output signals S6, P1, and N1 of the error detection circuit B 135 are input to registers 140A and 140B. Correction data are set in the registers 140A and 140B by S6, P1, and N1.

The adders 142A to 142D add the correction data for correcting the error. Registers 144A to 144D are provided for recovering the bit correction timing. Although the circuit for making an error correction at intervals of up to eight bits is shown in FIG. 25, adders and registers can be added for configuring a correction circuit of errors at any bit interval.

Such a configuration enables detection of errors at intervals of 6-bits or more and further correction of the detected error.

Figure 14:
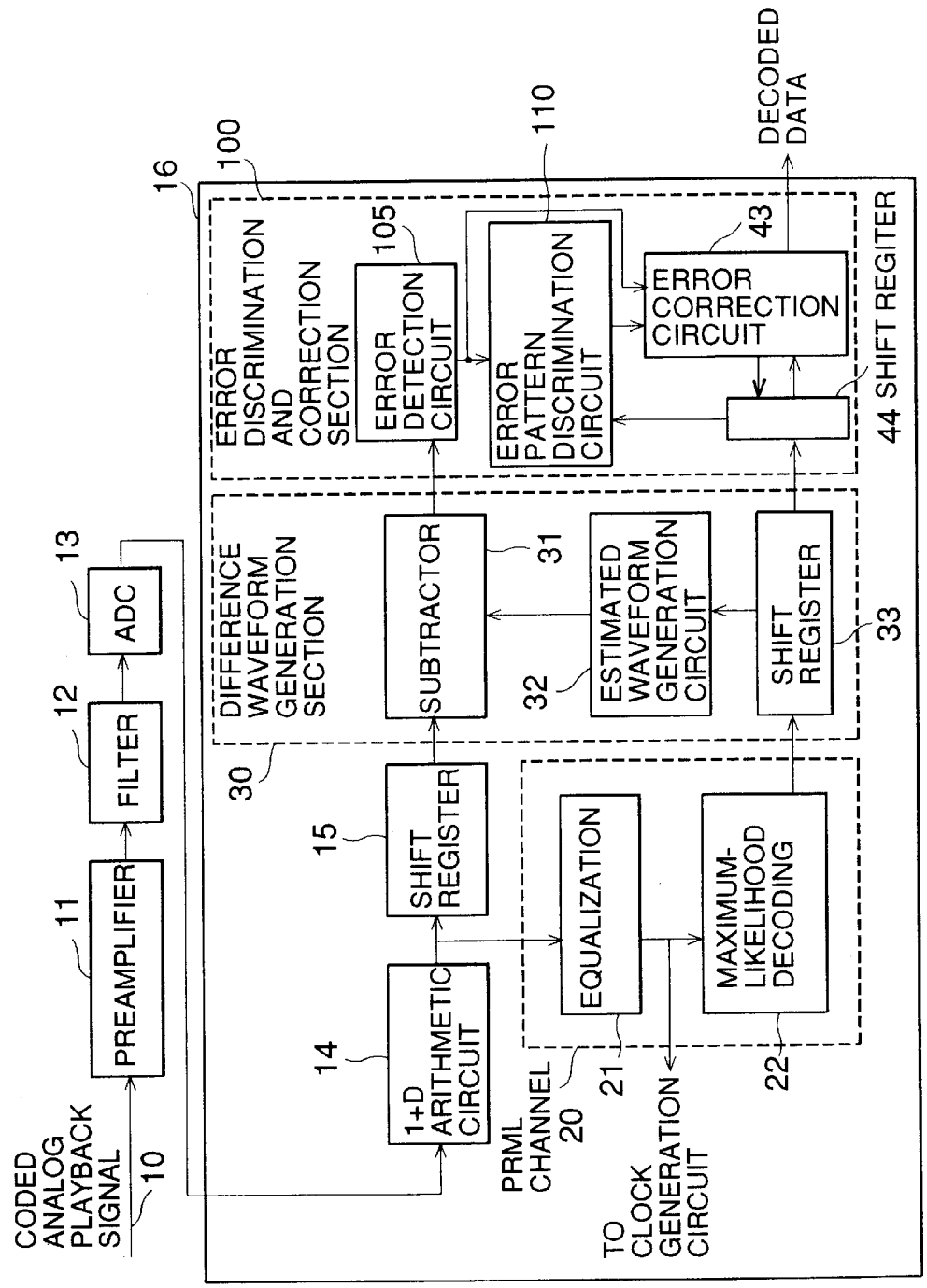
FIG. 14 is a block diagram of a digital signal processor in a second embodiment of the invention.

FIG. 14 shows a second embodiment of the invention. The configuration of the second embodiment shown in FIG. 14 is the same as that of the first embodiment shown in FIG. 1 except for an error detection circuit 105 or an error pattern discrimination circuit 110 in an error discrimination and correction section 100.

Figure 15:
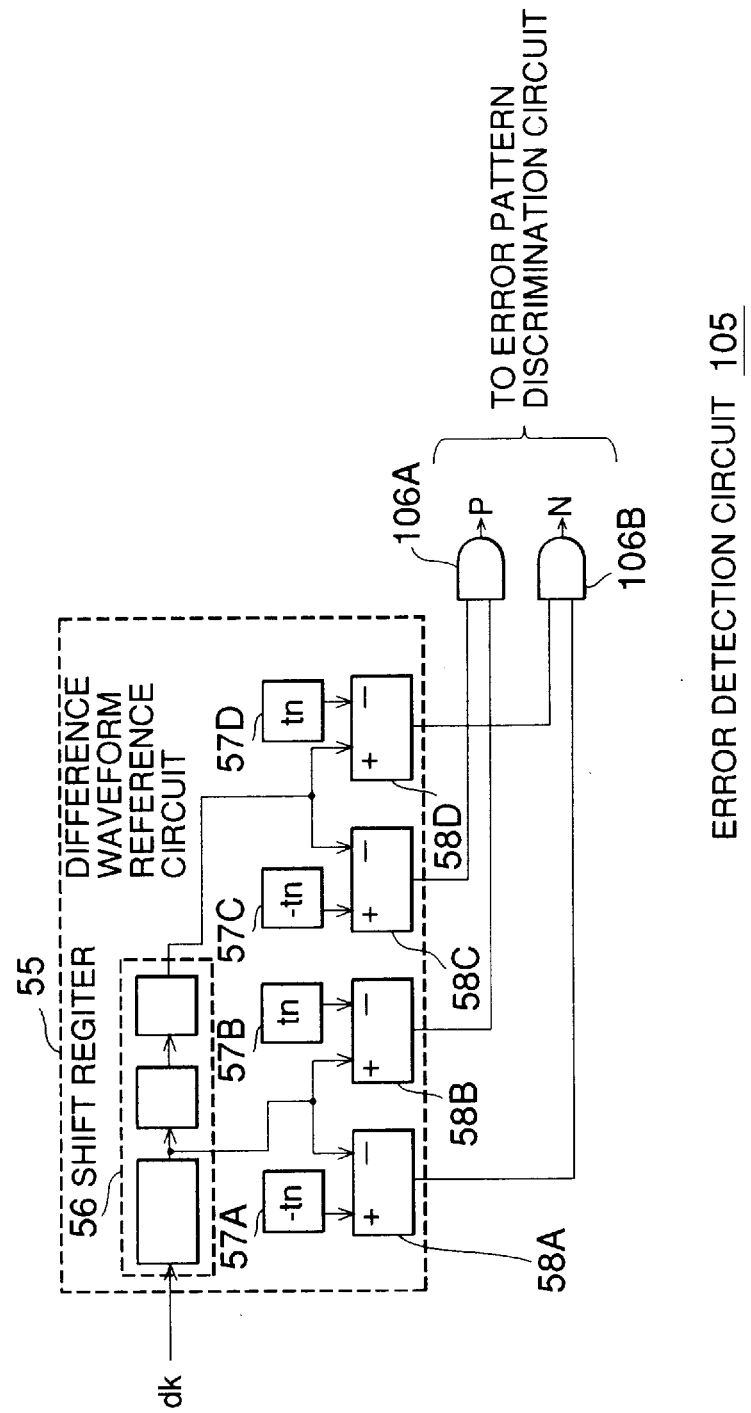
FIG. 15 is a block diagram explaining another embodiment of an error detection circuit.

First, the configuration of the error detection circuit 105 according to the second embodiment will be discussed with reference to FIG. 15. The error detection circuit 105 has a difference waveform reference circuit 55 having the same configuration as the difference waveform reference circuit 55 shown in FIG. 5 and logical elements 106A and 106B. Since the difference waveform reference circuit 55 can detect the error position by comparing a difference waveform with a threshold, an error is detected from an amplitude variation of the difference waveform provided by the difference waveform reference circuit 55 only. This configuration can simplify the circuitry drastically.

Figure 16:
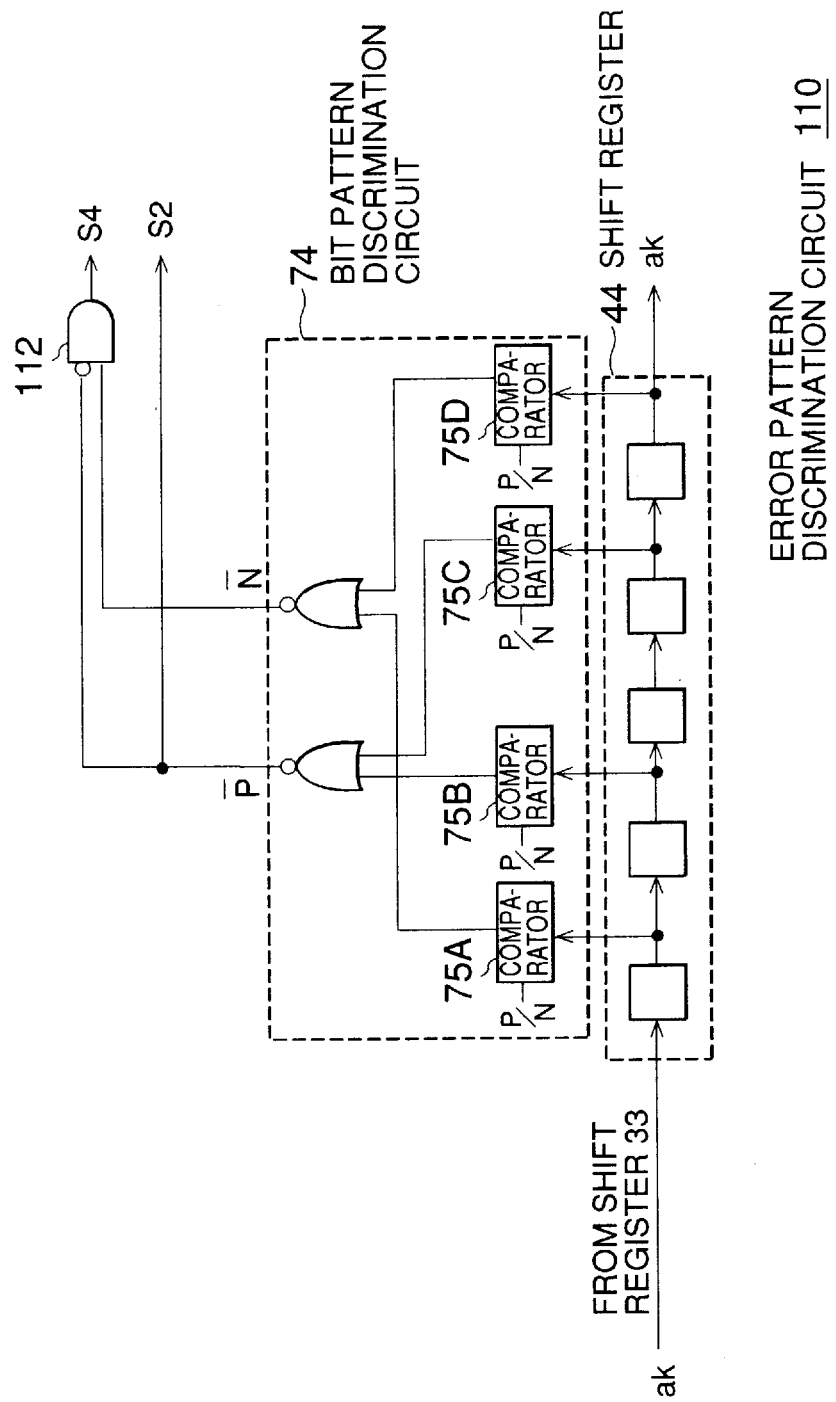
FIG. 16 is a block diagram explaining another embodiment of an error pattern discrimination circuit.

Next, the error pattern discrimination circuit 110 will be discussed with reference to FIG. 16. The error pattern discrimination circuit 110 comprises a bit pattern discrimination circuit 74, which is the same as the bit pattern discrimination circuit 74 in the error pattern discrimination circuit 42 shown in FIG. 9, and a logical element 112. It discriminates errors at 2-bit and 4-bit intervals from each other from the contents of the decoding result subjected to timing recovery by a shift register 44. The error pattern discrimination circuit 110 can be drastically simplified compared with the error pattern discrimination circuit 42 in the first embodiment.

Next, an example of using the digital signal processor in the first and second embodiments for a disk drive system will be discussed with reference to FIG. 21.

Figure 21:
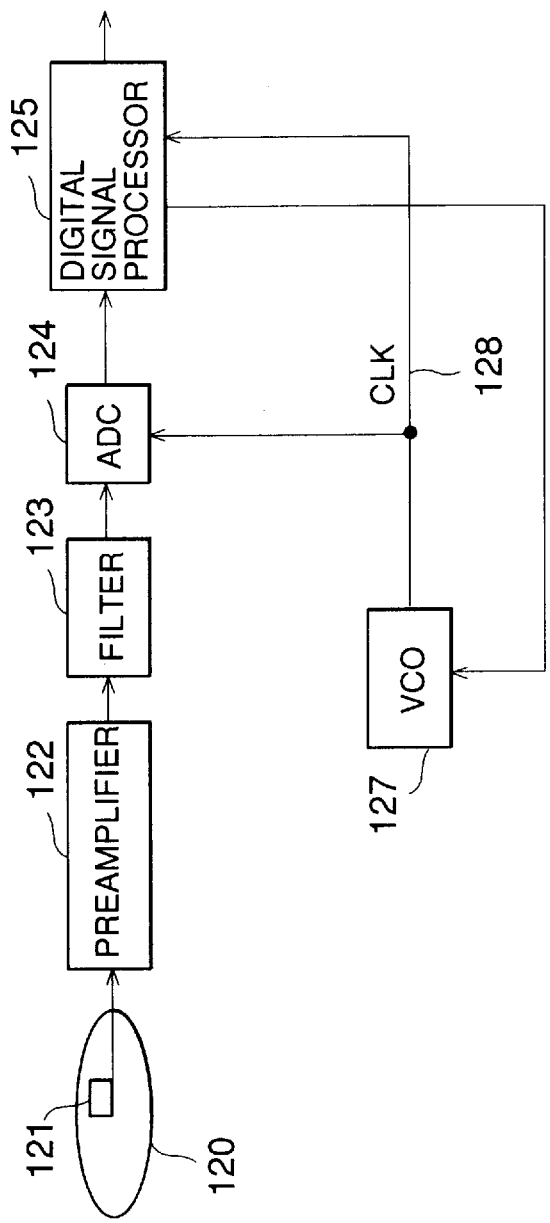
FIG. 21 is an overall block diagram of a disk drive system.

FIG. 21 shows a schematic configuration of a playback circuit of a disk drive system. Relating FIG. 21 to FIGS. 1, 14, and 17 for description, a playback signal (corresponding to the analog playback signal 10) read through a read head 121 from a recording medium (disk) 120 on which data is recorded, is amplified by a preamplifier 122 (corresponding to the preamplifier 11), then high-frequency noise is removed through a filter 123 (corresponding to the filter 12). The playback signal whose high-frequency noise is removed is converted into a digital value by an ADC (analog-digital converter) 124 (corresponding to the ADC 13) according to a sampling clock, then processed by a digital signal processor 125 (corresponding to the digital signal processor 16 of the invention).

However, the configuration is not thus limited. For example, equalization may be performed using a digital equalizer after A/D conversion or may be performed using an analog filter before A/D conversion, or both may be combined.

The signal is reproduced as a digital signal by the digital signal processor 125. A VCO 127 uses an output of the equalization circuit 21 in FIG. 1, 14, 17 to generate a clock signal CLK 128 determining the operation timing of each part, and supplies the clock signal CLK 128 to clock requiring circuits (not discretely shown) in the digital signal processor 125. Based on the clock 128, the digital signal processor 125 decodes the equalized signal and makes an error correction, as described above, and sends the resultant signal to a disk controller (not shown).

The disk controller, a host device, sets data in circuits in which values need to be preset, such as registers 54, 57, and 71 and RAMs 34 and 110 in the digital signal processor 125.

This can provide a magnetic disk reproducer with few decoding errors at the time of magnetic disk data reproduction. Thus, the magnetic disk reproducer according to the embodiment would provide a high magnetic disk recording density.

In the magnetic disk reproducer as shown in FIG. 21, only error detection may be executed instead of detecting and correcting an error, and when an error is detected, a read may be retried in the magnetic disk reproducer. An embodiment for the configuration will be discussed with reference to FIG. 17. The components shown in FIG. 17 are the same as those of the embodiment shown in FIG. 1 except for an error determination circuit 95.

Figure 17:
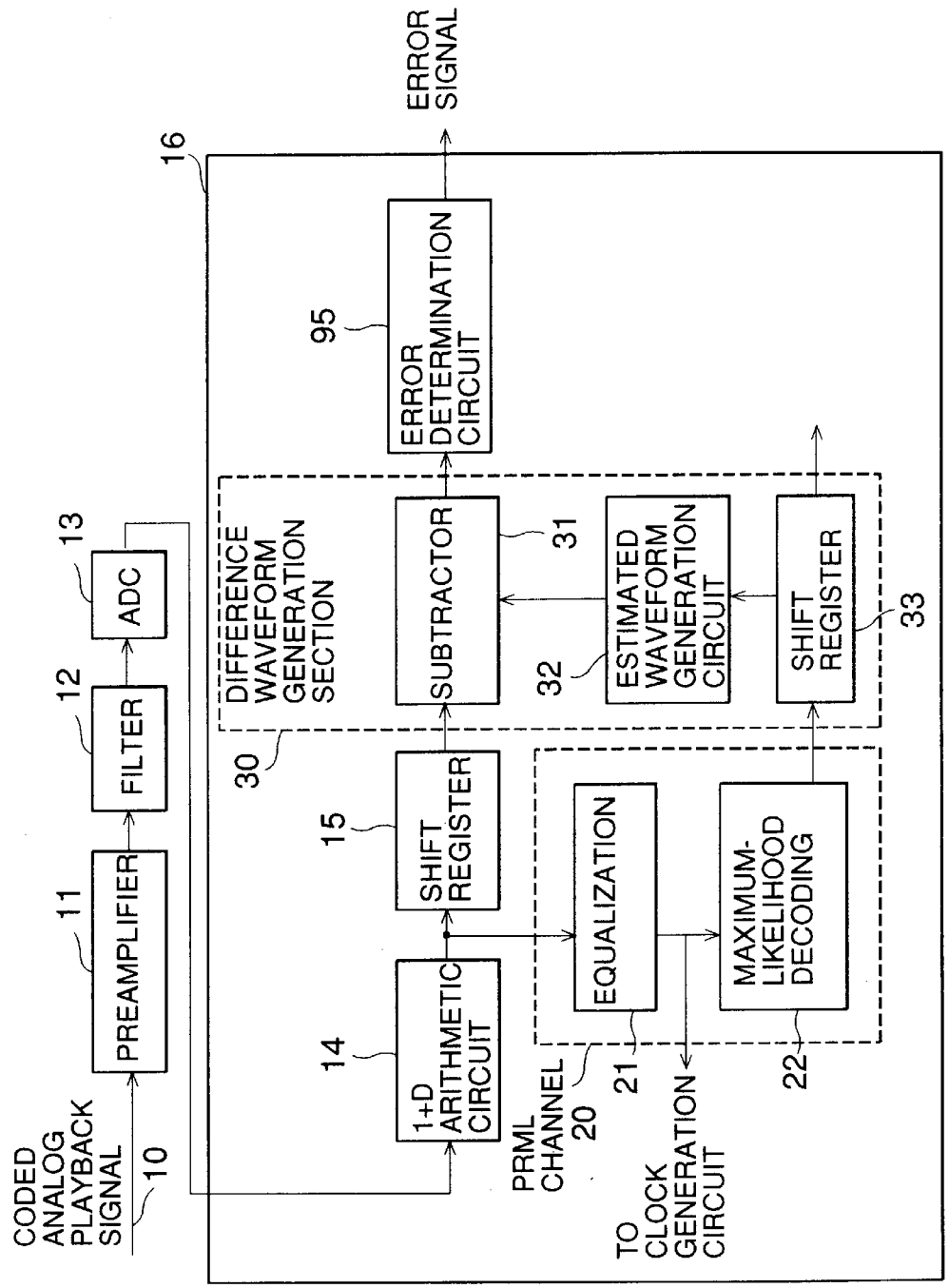
FIG. 17 is a block diagram of a digital signal processor in a third embodiment of the invention.

In FIG. 17, the error determination circuit 95 generates an error signal when the absolute value of the amplitude of a difference waveform output by a difference waveform generation section 30 or amplitude variation is equal to or greater than a given value. For example, by adopting a similar configuration to that of the difference waveform reference circuit in the first and second embodiments, whether or not an error occurs can be detected. If an error is detected, an error signal is sent to a disk controller, which again reads information from the portion for which the error signal is sent, so as to again execute data read back based on the error signal. This system enables error detection with only small increase in the number of circuit parts compared with conventional systems. Also, decoding errors can be drastically reduced by again executing a read operation.

Figure 20:
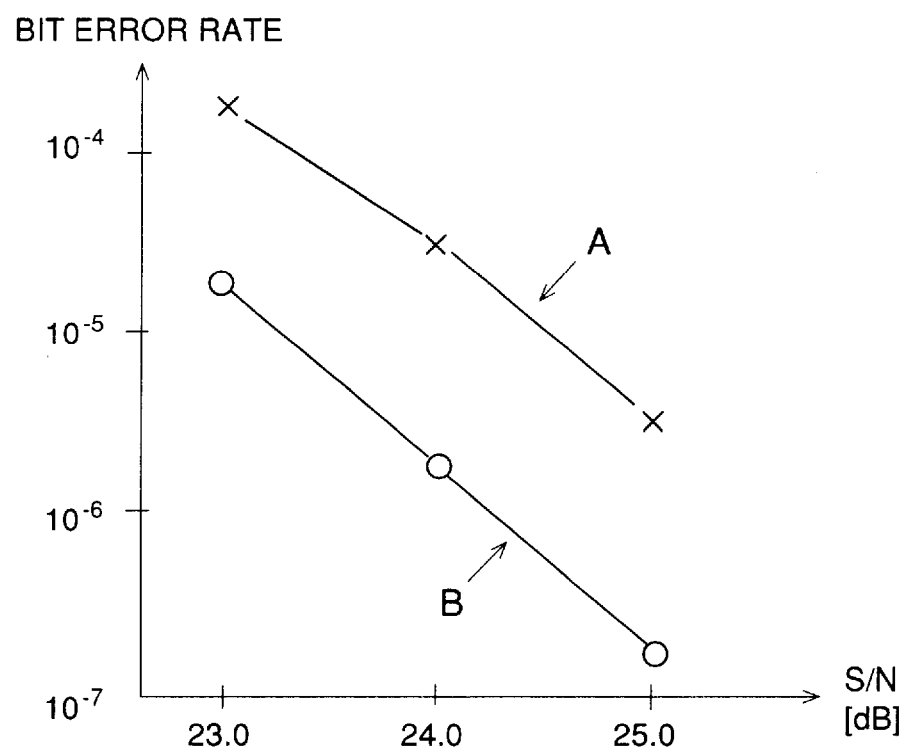
FIG. 20 is a graph plotting bit error rate against S/N in the invention.

According to the embodiments, while the most is made of the PRML, there are advantages such as the ability to perform high-speed decoding and to execute digital signal decoding with very few decoding errors. FIG. 20 shows an example of the reduction effect of the bit error rate in the embodiments. In FIG. 20, the recording density is set to 2.5 as the normalized linear density (the ratio between bit interval and extent at isolated waveform amplitude 1/2) and the S/N ratio of the signal at a data readback point (signal before A/D conversion) is changed for finding the bit error rate by simulation. In FIG. 20, A denotes the bit error rate of the decoding result by PRML and B denotes the bit error rate of the decoding result in the first embodiment. If these are compared with each other, the embodiment can reduce the bit error rate to one tenth or less compared with PRML.

According to the embodiments, a decoding error can be detected from the result decoded in the PRML channel without the need for complicated calculation. Also, errors can be corrected, providing channels with a low error rate and enabling high-density digital magnetic recording.

According to the embodiments, in the PRML channel, without the need for complicated calculation, the sample value of an input analog signal encoded with GCR code is processed and decoding errors can be reduced. High-density magnetic recording is enabled by using such digital decoding for a magnetic disk reproducing unit.

What is claimed is:

1. A digital signal processor for decoding a signal encoded by a predetermined data encoding system, said digital signal processor comprising:

a decoding circuit for encoding the encoded signal;

an estimated waveform generation circuit for generating a signal waveform estimated to result when noise of the encoded signal is removed from a decode value decoded by said decoding circuit;

a difference waveform generation circuit for generating a difference waveform representing a difference between the signal waveform generated by said estimated waveform generation circuit and the encoded signal; and a detection circuit for detecting a decode error in said decoding circuit based on the difference waveform generated by said difference waveform generation circuit;

wherein said predetermined data encoding system is a GCR (group coded recording) system, said decoding circuit for decoding the encoded signal by a partial response maximum likelihood system, and said detection circuit for detecting the decode error when an absolute value of amplitude of the difference waveform generated by said difference waveform generation circuit is greater than a predetermined threshold.

2. The digital signal processor as claimed in claim 1 wherein said detection circuit comprises:

a difference waveform reference circuit for determining to which of two predetermined types of amplitude variation, in opposite phase relation to each other, an amplitude variation of the difference waveform generated by said difference waveform generation circuit corresponds, by comparing a predetermined threshold with an amplitude of the difference waveform generated by said difference waveform generation circuit; and an error pattern discrimination circuit for selecting an error pattern group corresponding to the type of amplitude variation determined by said difference waveform reference circuit from two error pattern groups, each containing a plurality of error patterns, and discriminating an error pattern matching a decode error occurring with respect to the decode value decoded by said decoding circuit from other error patterns contained in the selected error pattern group; and the digital signal processor further comprising a correction circuit for correcting the decode value decoded by said decoding circuit when the error occurs, based on the type of amplitude variation determined by said difference waveform reference circuit and the error pattern discriminated by said error pattern discrimination circuit.

3. The digital signal processor as claimed in claim 1 wherein said estimated waveform generation circuit has a circuit for previously storing a signal waveform value defining the generated signal waveform and reads the signal waveform value stored in said storage circuit from the decode value decoded by said decoding circuit and generates the signal waveform from the read signal waveform value.

4. The digital signal processor as claimed in claim 3 wherein said storage circuit stores, at each address corresponding to a decode value, the signal waveform value of each signal waveform estimated from the corresponding decode value, and wherein said estimated waveform generation circuit reads signal waveform values stored in said storage circuit according to addresses corresponding to decode values, for each of two odd and even decode sequences provided by extracting the decode value decoded by said decoding circuit every other bit, and adds the signal waveform values read by using the decode values for each of the two decode sequences as addresses for generating the signal waveform.

5. The digital signal processor as claimed in claim 1 wherein said difference waveform generation circuit subtracts the signal waveform generated by said estimated waveform generation circuit from the encoded signal for generating the difference waveform.

6. The digital signal processor as claimed in claim 1 wherein said detection circuit comprises:

a difference waveform reference circuit for determining to which of two predetermined types of amplitude variation, in opposite phase relation to each other, an amplitude variation of the difference waveform generated by said difference waveform generation circuit corresponds, by comparing a predetermined threshold with an amplitude of the difference waveform generated by said difference waveform generation circuit;

an amplitude variation detection circuit for performing product sum calculation of the difference waveform generated by said difference waveform generation circuit and a predetermined error discrimination pattern and determining to which of the two predetermined types of amplitude variation the amplitude variation of the difference waveform generated by said difference waveform generation circuit corresponds, according to the result of the product sum calculation;

a determination circuit for determining to which of the two predetermined types of amplitude variation the amplitude variation of the difference waveform generated by said difference waveform generation circuit corresponds, based on the determination result of said difference waveform reference circuit and the determination result of said amplitude variation detection circuit; and an error pattern discrimination circuit for selecting an error pattern group corresponding to the type of amplitude variation determined by said determination circuit from two error pattern groups, each containing a plurality of error patterns and discriminating an error pattern matching a decode error occurring with respect to the decode value decoded by said decoding circuit from other error patterns contained in the selected error pattern group; and the digital signal processor further comprising a correction circuit for correcting the decode value decoded by said decoding circuit when the error occurs, based on the type of amplitude variation determined by said determination circuit and the error pattern discriminated by said error pattern discrimination circuit.

7. The digital signal processor as claimed in claim 1 wherein said detection circuit comprises:

a difference waveform reference circuit for determining to which of two predetermined types of amplitude variation, in opposite phase relation to each other, an amplitude variation of the difference waveform generated by said difference waveform generation circuit corresponds, by comparing a predetermined threshold with an amplitude of the difference waveform generated by said difference waveform generation circuit;

an amplitude variation detection circuit for determining to which of the two predetermined types of amplitude variation the amplitude variation of the difference waveform corresponds, based on an addition value of a plurality of successive difference waveform values in the difference waveform generated by said difference waveform generation circuit;

a determination circuit for determining to which of the two predetermined types of amplitude variation the amplitude variation of the difference waveform generated by said difference waveform generation circuit corresponds, based on the determination result of said difference waveform reference circuit and the determination result of said amplitude variation detection circuit; and an error pattern discrimination circuit for selecting an error pattern group corresponding to the type of amplitude variation determined by said determination circuit from two error pattern groups each containing a plurality of error patterns and discriminating an error pattern matching a decode error occurring with respect to the decode value decoded by said decoding circuit from other error patterns contained in the selected error pattern group; and the digital signal processor further comprising a correction circuit for correcting the decode value decoded by said decoding circuit when the error occurs, based on the type of amplitude variation determined by said determination circuit and the error pattern discriminated by said error pattern discrimination circuit.

8. The digital signal processor as claimed in claim 2 wherein said error pattern discrimination circuit uses error patterns where error occurrence bit intervals are intervals of even bits as the error patterns contained in each of the two error pattern groups.

9. The digital signal processor as claimed in claim 8 wherein if the intervals of even bits are bit intervals of two bits and four bits, when a predetermined error pattern that cannot be corrected among the 2-bit and 4-bit interval error patterns contained in the selected error pattern group is detected from the decode value decoded by said decoding circuit, said error pattern discrimination circuit adopts an error pattern other than the predetermined error pattern that cannot be corrected as the error pattern matching a decode error occurring with respect to the decode value decoded by said decoding circuit, for discriminating the error pattern.

10. An error detection method used when a signal encoded by a predetermined data encoding system which is a GCR (group coded recording) system is decoded, said method comprising the steps of:

decoding the encoded signal by a partial response maximum likelihood system;

generating a signal waveform estimated to result when noise of the encoded signal is removed from a decode value decoded by a decoder;

subtracting the generated signal waveform from the encoded signal and generating a difference waveform representing the difference; and detecting a decode error when an absolute value of amplitude of the difference waveform is greater than a predetermined threshold.

11. A recording medium reproducer for reading a signal from a recording medium for playing the recording medium, comprising:

a read circuit for reading a playback signal from the recording medium;

an amplification circuit for amplifying the playback signal read by said read circuit;

a filter for removing high-frequency noise of the playback signal amplified by said amplification circuit;

an analog-digital conversion circuit for converting the playback signal, whose high-frequency noise is removed through said filter, into a digital signal;

an equalization circuit for equalizing the digital value into which the playback signal is converted by said analog-digital conversion circuit;

a decoding circuit for decoding the digital value equalized by said equalization circuit;

an estimated waveform generation circuit for generating a signal waveform estimated to result when noise of the encoded signal is removed from a decode value decoded by said decoding circuit;

a difference waveform generation circuit for generating a difference waveform between the signal waveform generated by said estimated waveform generation circuit and the encoded signal; and a detection circuit for detecting a decode error in said decoding circuit based on the difference waveform generated by said difference waveform generation circuit.

12. The recording medium reproducer as claimed in claim 11 further including an output circuit for outputting a signal instructing said read circuit to again read the playback signal to said read circuit when said detection circuit detects a decode error.

* * * * *